US012575102B2

(12) United States Patent (10) Patent No.: US 12,575,102 B2
Fukuzumi et al. (45) Date of Patent: Mar. 10, 2026

(54) MERGED CAVITIES AND BURIED ETCH STOPS FOR THREE-DIMENSIONAL MEMORY ARRAYS

(71) Applicant: Micron Technology, Inc., Boise, ID (US)

(72) Inventors: Yoshiaki Fukuzumi, Yokohama (JP); David H. Wells, Boise, ID (US); Byeung Chul Kim, Boise, ID (US); Richard J. Hill, Boise, ID (US); Paolo Tessariol, Arcore (IT)

(73) Assignee: Micron Technology, Inc., Boise, ID (US)

( * ) Notice: Subject to any disclaimer, the term of this patent is extended or adjusted under 35 U.S.C. 154(b) by 824 days.

(21) Appl. No.: 17/884,299

(22) Filed: Aug. 9, 2022

(65) Prior Publication Data

US 2023/0397422 A1 Dec. 7, 2023

Related U.S. Application Data

(60) Provisional application No. 63/348,429, filed on Jun. 2, 2022.

(51) Int. Cl.
*G11C 11/34* (2006.01)
*H10B 43/27* (2023.01)
(52) U.S. Cl.
CPC .................................. *H10B 43/27* (2023.02)
(58) Field of Classification Search
CPC ...................................................... H10B 43/27
USPC .................................................... 365/185.17
See application file for complete search history.

(56) References Cited

U.S. PATENT DOCUMENTS

| | | | | |
|---|---|---|---|---|
| 9,443,866 B1 * | 9/2016 | Sakakibara | ............ | H10B 43/10 |
| 9,799,671 B2 * | 10/2017 | Pachamuthu | ......... | H01L 21/768 |
| 10,902,925 B1 * | 1/2021 | Lien | ........................ | G11C 16/10 |
| 10,943,622 B2 * | 3/2021 | Narui | ..................... | H10B 12/00 |
| 11,911,881 B2 * | 2/2024 | Araki | ..................... | B25B 23/147 |
| 11,991,881 B2 * | 5/2024 | Tanaka | ................... | H10B 41/35 |
| 12,035,525 B2 * | 7/2024 | Zhang | .................... | H10B 41/10 |
| 2014/0248763 A1 * | 9/2014 | Konevecki | ........... | H10N 70/883 |
| | | | | 438/591 |
| 2014/0264527 A1 * | 9/2014 | Koval | .................... | H10D 30/63 |
| | | | | 438/257 |
| 2015/0093865 A1 * | 4/2015 | Shim | ...................... | H10B 43/10 |
| | | | | 438/268 |
| 2020/0202962 A1 * | 6/2020 | Chen | .................. | G11C 16/0483 |

(Continued)

*Primary Examiner* — Viet Q Nguyen
(74) *Attorney, Agent, or Firm* — Holland & Hart LLP

(57) ABSTRACT

Methods, systems, and devices for merged cavities and buried etch stops for three-dimensional memory arrays are described. For example, a row of cavities may be formed using a cavity etching process and material separating cavities of the row may be removed to merge the row of cavities to form a trench. In some cases, a trench may be formed from multiple rows of cavities. Additionally, or alternatively, a trench may be formed from a pattern of cavities that includes different quantities of rows at different locations along the trench. In some examples, etch stopping material portions (e.g., etch stops) may be formed at locations corresponding to cavities prior to the cavity etching process. For example, exposed material surfaces at locations corresponding to cavities or trenches may be oxidized to form etch stops.

20 Claims, 23 Drawing Sheets

TOP VIEW 300-k

SECTION A-A 300-k

(56) References Cited

U.S. PATENT DOCUMENTS

| | | | | |
|---|---|---|---|---|
| 2023/0100548 A1* | 3/2023 | Ko | .................. | H10B 43/10 |
| | | | | 365/185.18 |
| 2023/0282281 A1* | 9/2023 | Wang | .............. | H10B 41/10 |
| | | | | 257/314 |

* cited by examiner

SECTION A-A

SECTION A-A

SECTION A-A 300-d

SECTION A-A 300-e

SECTION A-A 300-f

SECTION A-A 300-g 1115    1115    1110

1125

1105

1120

905

1005

915
910
810
805
325
320

315

SECTION A-A 710
705    505

300-i

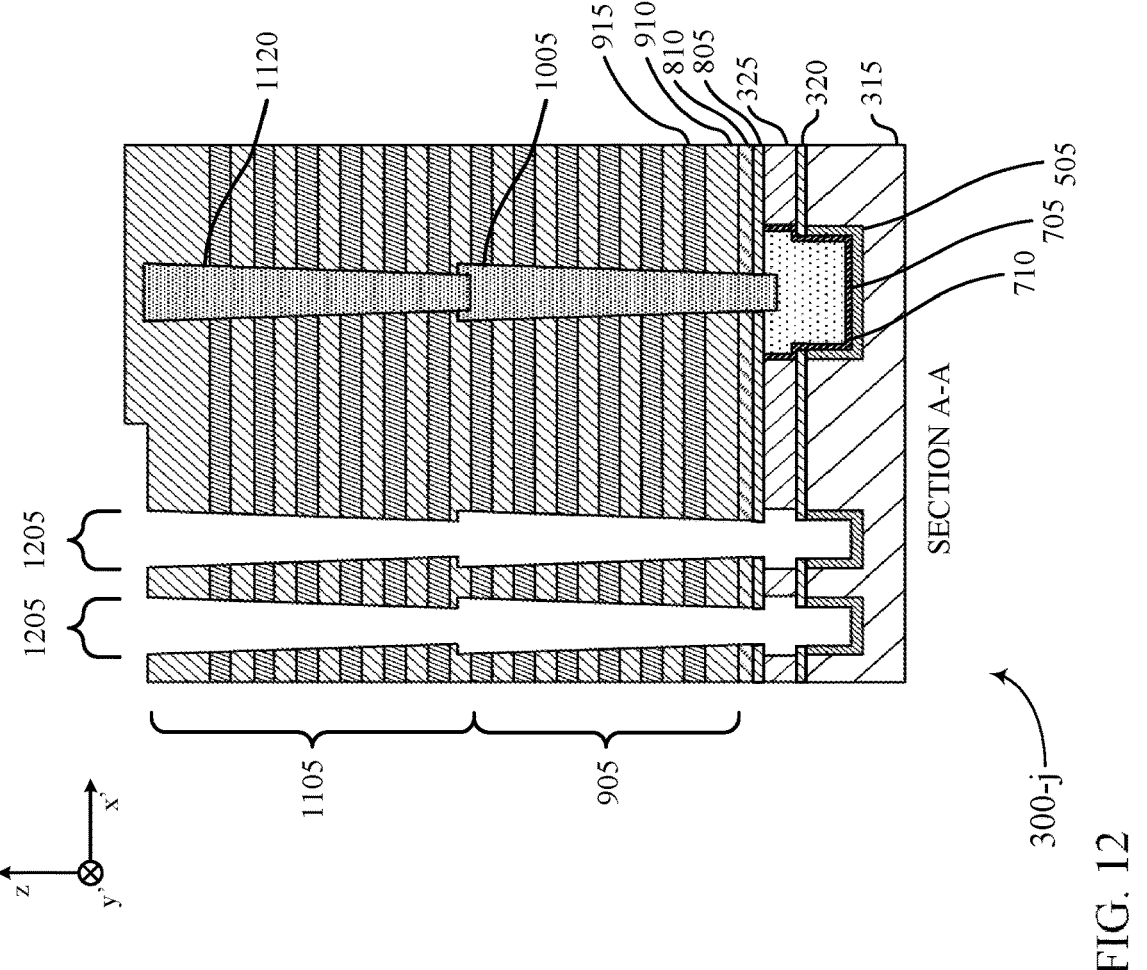
SECTION A-A
FIG. 12
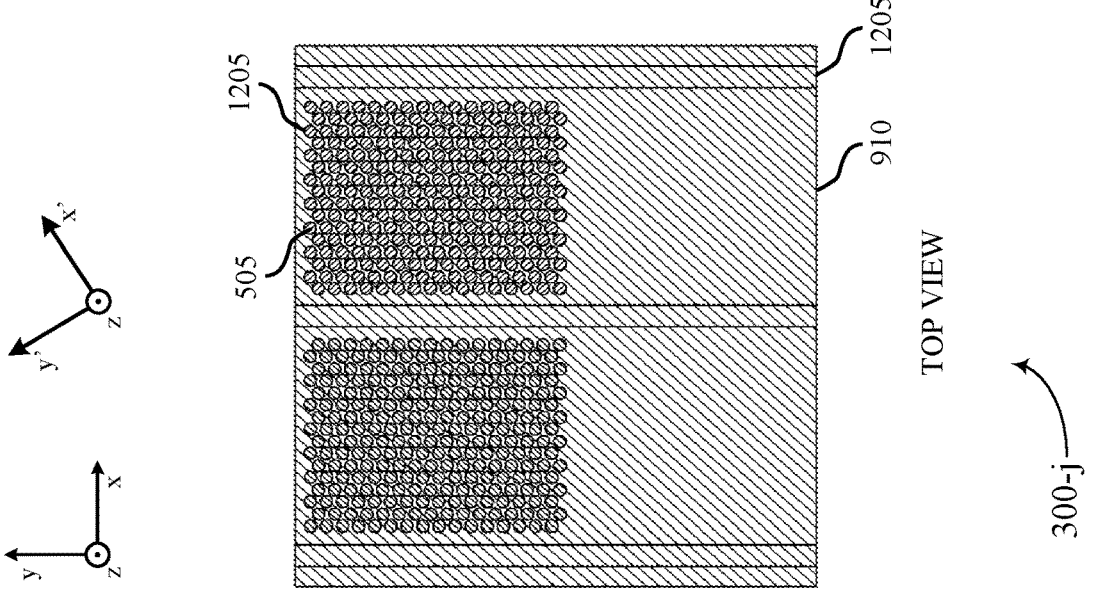
TOP VIEW 1115                1115                1115

910

1415
1410-b    1410-a    1405    TOP VIEW 300-1

FIG. 14

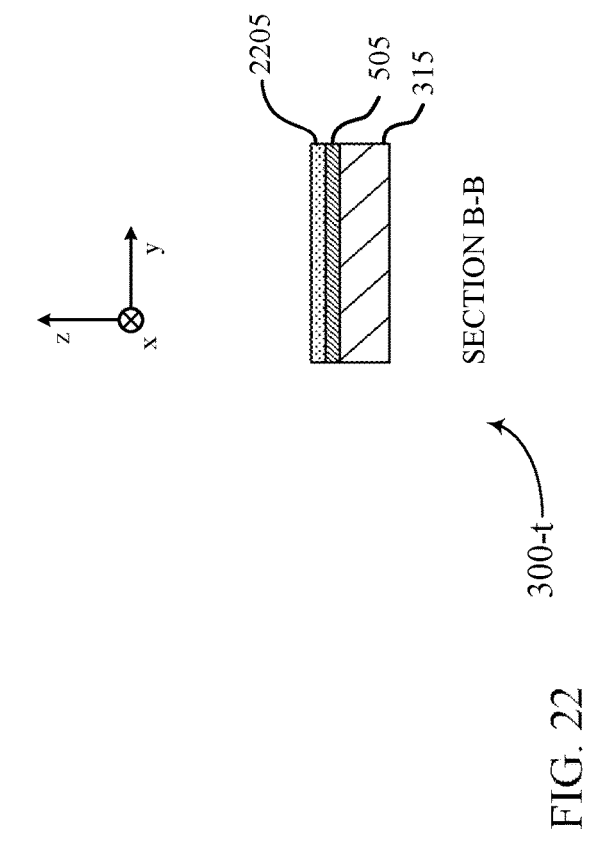
SECTION B-B
300-t
FIG. 22
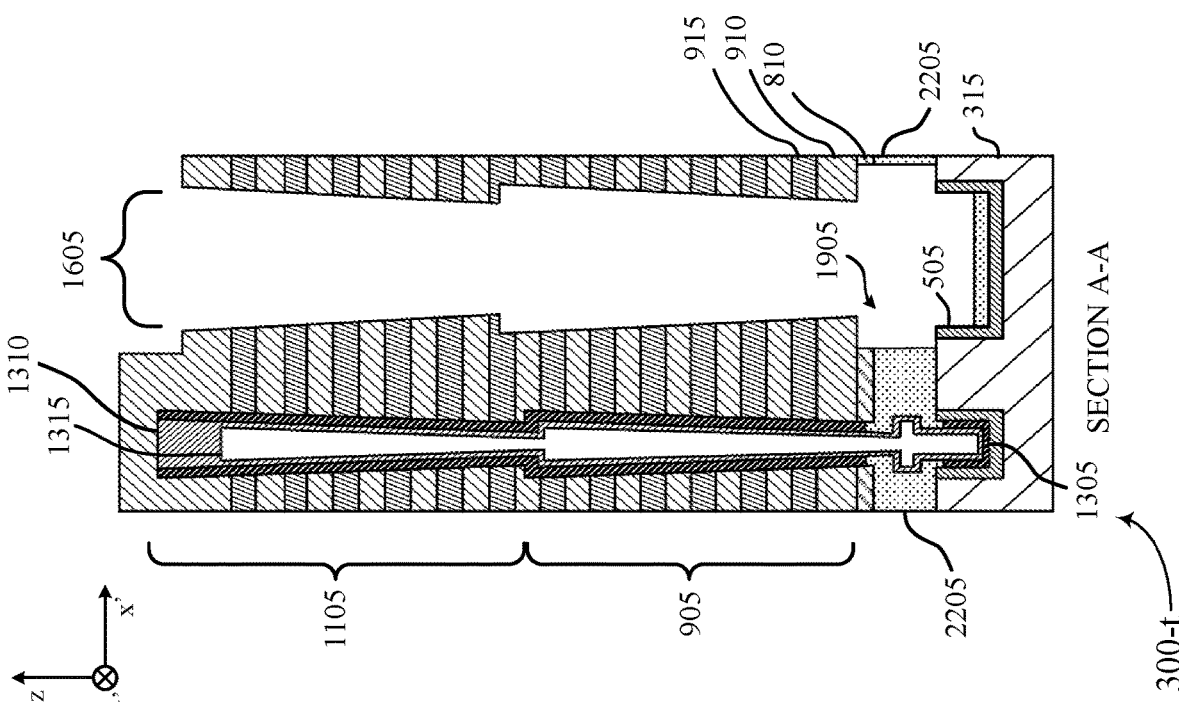
SECTION A-A

TOP VIEW

TOP VIEW

TOP VIEW

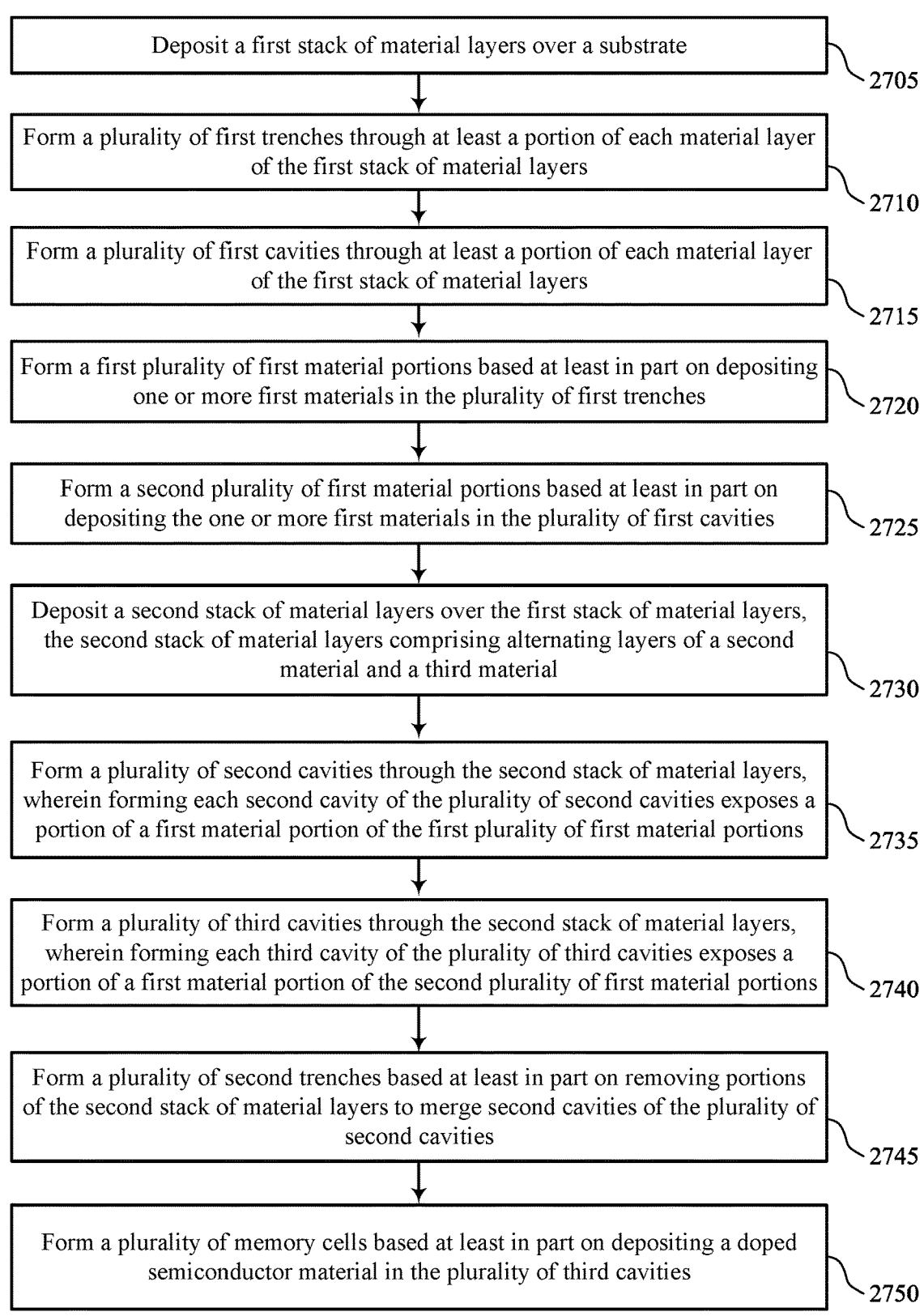

Deposit a first stack of material layers over a substrate ⟋2705

Form a plurality of first trenches through at least a portion of each material layer of the first stack of material layers ⟋2710

Form a plurality of first cavities through at least a portion of each material layer of the first stack of material layers ⟋2715

Form a first plurality of first material portions based at least in part on depositing one or more first materials in the plurality of first trenches ⟋2720

Form a second plurality of first material portions based at least in part on depositing the one or more first materials in the plurality of first cavities ⟋2725

Deposit a second stack of material layers over the first stack of material layers, the second stack of material layers comprising alternating layers of a second material and a third material ⟋2730

Form a plurality of second cavities through the second stack of material layers, wherein forming each second cavity of the plurality of second cavities exposes a portion of a first material portion of the first plurality of first material portions ⟋2735

Form a plurality of third cavities through the second stack of material layers, wherein forming each third cavity of the plurality of third cavities exposes a portion of a first material portion of the second plurality of first material portions ⟋2740

Form a plurality of second trenches based at least in part on removing portions of the second stack of material layers to merge second cavities of the plurality of second cavities ⟋2745

Form a plurality of memory cells based at least in part on depositing a doped semiconductor material in the plurality of third cavities ⟋2750

FIG. 27     ⟍2700

MERGED CAVITIES AND BURIED ETCH STOPS FOR THREE-DIMENSIONAL MEMORY ARRAYS

The present Application for patent claims the benefit of U.S. Provisional Patent Application No. 63/348,429 by Fukuzumi et al., entitled "MERGED CAVITIES AND BURIED ETCH STOPS FOR THREE-DIMENSIONAL MEMORY ARRAYS," filed Jun. 2, 2022, assigned to the assignee hereof, and expressly incorporated by reference herein.

FIELD OF TECHNOLOGY

The following relates to one or more systems for memory, including merged cavities and buried etch stops for three-dimensional memory arrays.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read (e.g., sense, detect, retrieve, identify, determine, evaluate) the state of one or more memory cells within the memory device. To store information, a component may write (e.g., program, set, assign) one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 2-dimensional cross-point memory (3D cross point), not-or (NOR) and not-and (NAND) memory devices, and others. Memory devices may be described in terms of volatile configurations or non-volatile configurations. Volatile memory cells (e.g., DRAM) may lose their programmed states over time unless they are periodically refreshed by an external power source. Non-volatile memory cells (e.g., NAND) may maintain their programmed states for extended periods of time even in the absence of an external power source.

BRIEF DESCRIPTION OF THE DRAWINGS

FIGS. 3 through 26 illustrate examples of operations that support merged cavities and buried etch stops for three-dimensional memory arrays in accordance with examples as disclosed herein.

FIG. 27 shows a flowchart illustrating a method or methods that support merged cavities and buried etch stops for three-dimensional memory arrays in accordance with examples as disclosed herein.

DETAILED DESCRIPTION

Figure 1:
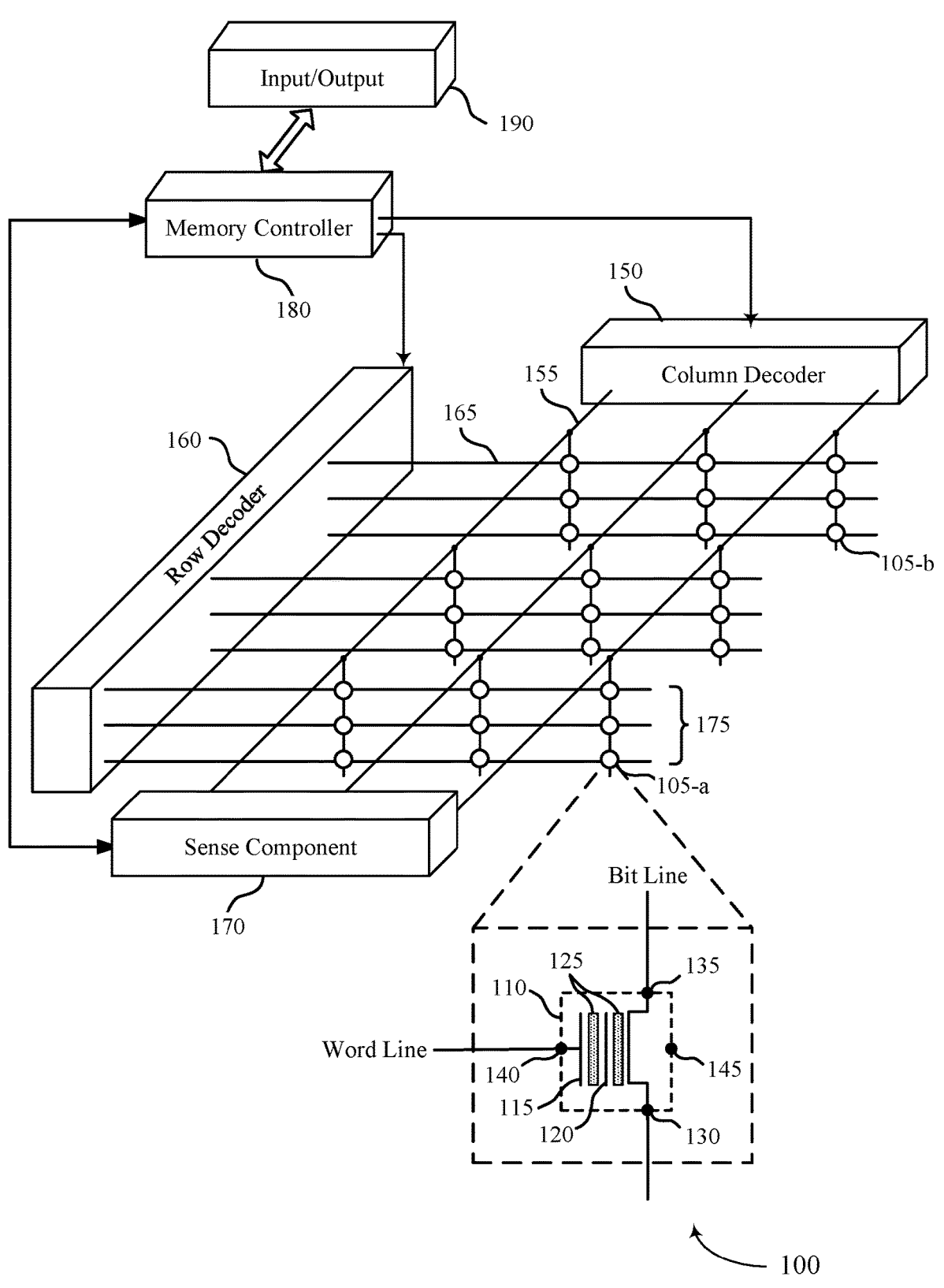
FIG. 1 illustrates an example of a system that supports merged cavities and buried etch stops for three-dimensional memory arrays in accordance with examples as disclosed herein.

In some memory manufacturing operations, one or more materials may be deposited over a substrate, such as a semiconductor substrate, and portions of the one or more materials may be removed in accordance with various patterning operations. For example, a pattern of cavities may be formed by removing one or more materials along a thickness direction in accordance with a pattern of openings having one or more various cross-sectional profiles (e.g., circular cross-sections, elliptical cross-sections, polygonal cross-sections), and trenches (e.g., slits) may be formed by removing materials along the thickness direction in accordance with openings having relatively elongated profiles (e.g., an elongated rectangular profile, a linear profile, a boundary profile between or enclosing remaining portions of materials). In some examples, memory cells may be formed at least in part by depositing one or more storage materials in cavities, and trenches may be used to isolate regions of a memory array (e.g., to isolate blocks of memory cells based at least in part on depositing a dielectric material in associated trenches that surround the blocks).

In some examples, material removal operations may be associated with a taper along a direction of material removal (e.g., along a thickness direction). For example, relatively deeper portions of cavities may be associated with a smaller cross-section than relatively shallower portions of the cavities (e.g., a cross section of a cavity opening), and relatively deeper portions of trenches may be associated with a smaller separation between trench walls than relatively shallower portions of the trenches (e.g., a separation between trench walls at a trench opening). In some examples, forming trenches may be associated with a greater degree of taper than forming cavities, which may have a greater effect on memory die layout with large aspect ratios (e.g., a ratio of depth of material removal to width of a material removal opening, a ratio between height and width of associated structures). For example, a greater taper of trenches may lead to adverse physical characteristics of a memory die, such as misalignment between trenches and memory structures (e.g., an overlap between trenches and cavities), structural defects (e.g., block-bending), poor process margins (e.g., tolerances), and increased process costs, particularly as aspect ratios grow with a scaling of memory dies along a thickness direction (e.g., relative to a substrate).

In accordance with examples as disclosed herein, trenches of a memory die may be formed by merging patterns of cavities, reducing a degree of taper compared to forming each trench by removing material in accordance with a single elongated opening. For example, a row of cavities may be formed using a cavity etching process and material separating cavities of the row may be removed (e.g., in a selective etching operation) to merge the row of cavities, forming a trench. In some cases, a trench may be formed from multiple rows of cavities. Additionally, or alternatively, a trench may be formed from a pattern of cavities that includes different quantities of rows at different locations along the trench. Because cavities may be associated with a smaller degree of taper than a trench formed in accordance with a single elongated opening, a trench formed by merging a pattern of cavities will also be associated with a smaller degree of taper. Accordingly, such techniques will enable fewer misalignments between trenches and memory structures, fewer structural defects, improved process margins, and reduced process costs, among other benefits. In some examples, process margins may be further improved by forming etch stopping material portions (e.g., etch stops) at locations corresponding to cavities prior to the cavity etching process. For example, exposed material surfaces at locations corresponding to cavities or trenches may be oxidized to form etch stops, improving the accuracy of subsequent etching processes.

Figure 2:
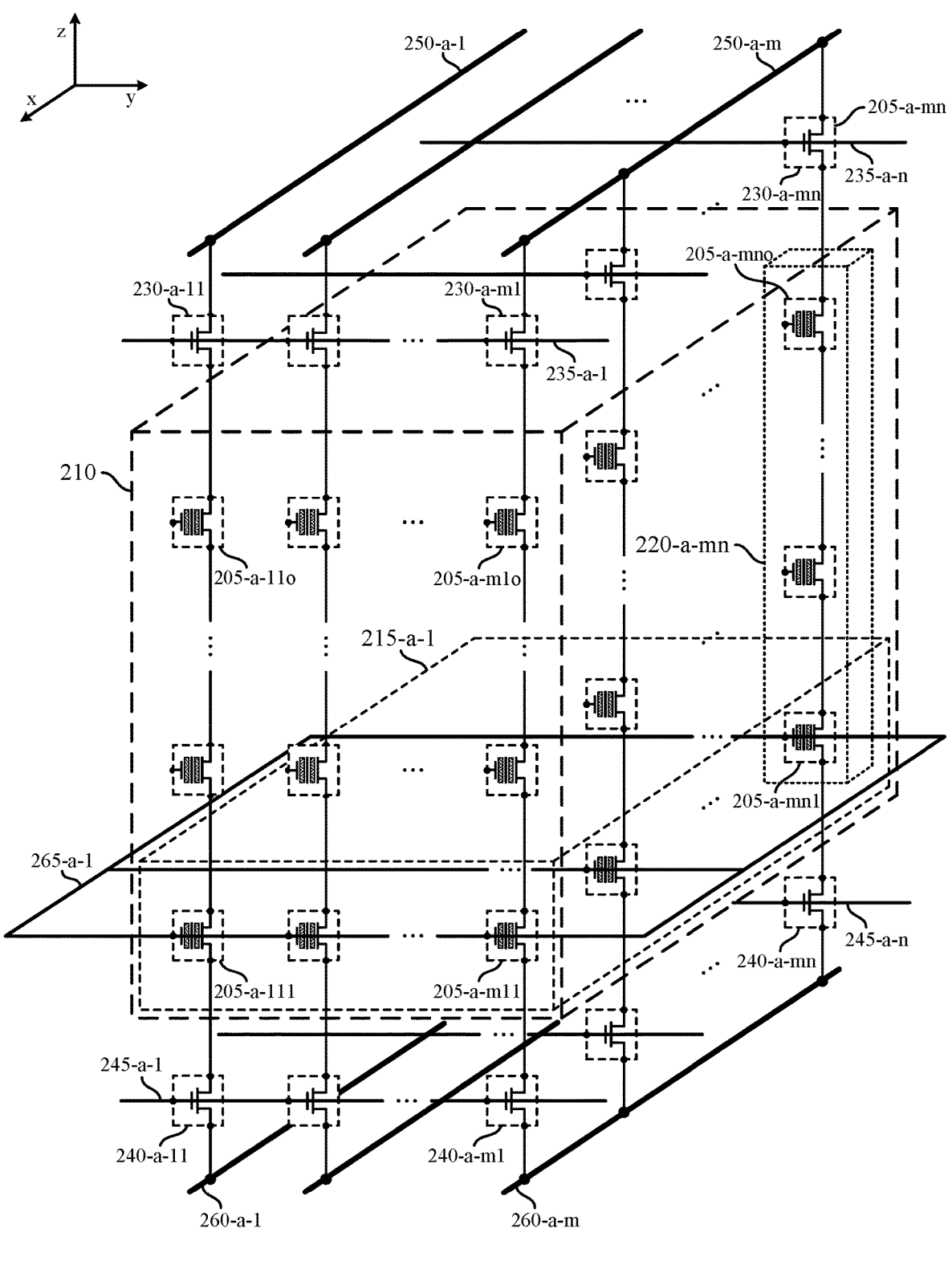
FIG. 2 illustrates an example of a memory architecture that supports merged cavities and buried etch stops for three-dimensional memory arrays in accordance with examples as disclosed herein.

Features of the disclosure are initially described in the context of systems, devices, and circuits with reference to FIGS. 1 and 2. Features of the disclosure are described in the context of operations for material arrangements with reference to FIGS. 3 through 26. These and other features of the disclosure are further illustrated by and described in the context of a flowchart that relate to merged cavities and buried etch stops for three-dimensional memory arrays with reference to FIG. 27.

FIG. 1 illustrates an example of a memory device 100 that supports merged cavities and buried etch stops for three-dimensional memory arrays in accordance with examples as disclosed herein. FIG. 1 is an illustrative representation of various components and features of the memory device 100. As such, the components and features of the memory device 100 are shown to illustrate functional interrelationships, and not necessarily physical positions within the memory device 100. Further, although some elements included in FIG. 1 are labeled with a numeric indicator, some other corresponding elements are not labeled, even though they are the same or would be understood to be similar, in an effort to increase visibility and clarity of the depicted features.

The memory device 100 may include one or more memory cells, such as memory cell 105-*a* and memory cell 105-*b*. In some examples, a memory cell 105 may be a NAND memory cell, such as in the blow-up diagram of memory cell 105-*a*. Each memory cell 105 may be programmed to store a logic value representing one or more bits of information. In some examples, a single memory cell 105—such as a memory cell 105 configured as a single-level cell (SLC)—may be programmed to one of two supported states and thus may store one bit of information at a time (e.g., a logic 0 or a logic 1). In some other examples, a single memory cell 105—such as a memory cell 105 configured as a multi-level cell (MLC), a tri-level cell (TLC), a quad-level cell (QLC), or other type of multiple-level memory cell 105—may be programmed to one of more than two supported states and thus may store more than one bit of information at a time. In some cases, a multiple-level memory cell 105 (e.g., an MLC memory cell, a TLC memory cell, a QLC memory cell) may be physically different than an SLC cell. For example, a multiple-level memory cell 105 may use a different cell geometry or may be fabricated using different materials. In some examples, a multiple-level memory cell 105 may be physically the same or similar to an SLC cell, and other circuitry in a memory block (e.g., a controller, sense amplifiers, drivers) may be configured to operate (e.g., read and program) the memory cell as an SLC cell, or as an MLC cell, or as a TLC cell, etc.

In some NAND memory arrays, each memory cell 105 may be illustrated as a transistor that includes a charge trapping structure (e.g., a floating gate, a replacement gate, a dielectric material) for storing an amount of charge representative of a logic value. For example, the blow-up in FIG. 1 illustrates a NAND memory cell 105-*a* that includes a transistor 110 (e.g., a metal-oxide-semiconductor (MOS) transistor) that may be used to store a logic value. The transistor 110 may include a control gate 115 and a charge trapping structure 120 (e.g., a floating gate, a replacement gate), where the charge trapping structure 120 may, in some examples, be between two portions of dielectric material 125. The transistor 110 also may include a first node 130 (e.g., a source or drain) and a second node 135 (e.g., a drain or source). A logic value may be stored in transistor 110 by storing (e.g., writing) a quantity of electrons (e.g., an amount of charge) on the charge trapping structure 120. An amount of charge to be stored on the charge trapping structure 120 may depend on the logic value to be stored. The charge stored on the charge trapping structure 120 may affect the threshold voltage of the transistor 110, thereby affecting the amount of current that flows through the transistor 110 when the transistor 110 is activated (e.g., when a voltage is applied to the control gate 115, when the memory cell 105-*a* is read). In some examples, the charge trapping structure 120 may be an example of a floating gate or a replacement gate that may be part of a 3D NAND structure. For example, a 3D NAND array may include multiple control gates 115 and charge trapping structures 120 arranged around a single channel (e.g., a horizontal channel, a vertical channel, a columnar channel, a pillar channel).

A logic value stored in the transistor 110 may be sensed (e.g., as part of a read operation) by applying a voltage to the control gate 115 (e.g., to control node 140, via a word line 165) to activate the transistor 110 and measuring (e.g., detecting, sensing) an amount of current that flows through the first node 130 or the second node 135 (e.g., via a bit line 155). For example, a sense component 170 may determine whether an SLC memory cell 105 stores a logic 0 or a logic 1 in a binary manner (e.g., based on a presence or absence of a current through the memory cell 105 when a read voltage is applied to the control gate 115, based on whether the current is above or below a threshold current). For a multiple-level memory cell 105, a sense component 170 may determine a logic value stored in the memory cell 105 based on various intermediate threshold levels of current when a read voltage is applied to the control gate 115, or by applying different read voltages to the control gate and evaluating different resulting levels of current through the transistor 110, or various combinations thereof. In one example of a multiple-level architecture, a sense component 170 may determine the logic value of a TLC memory cell 105 based on eight different levels of current, or ranges of current, that define the eight potential logic values that could be stored by the TLC memory cell 105.

An SLC memory cell 105 may be written by applying one of two voltages (e.g., a voltage above a threshold or a voltage below a threshold) to memory cell 105 to store, or not store, an electric charge on the charge trapping structure 120 and thereby cause the memory cell 105 store one of two possible logic values. For example, when a first voltage is applied to the control node 140 (e.g., via a word line 165) relative to a bulk node 145 (e.g., a body node) for the transistor 110 (e.g., when the control node 140 is at a higher voltage than the bulk), electrons may tunnel into the charge trapping structure 120. Injection of electrons into the charge trapping structure 120 may be referred to as programming the memory cell 105 and may occur as part of a write operation. A programmed memory cell may, in some cases, be considered as storing a logic 0. When a second voltage is applied to the control node 140 (e.g., via the word line 165) relative to the bulk node 145 for the transistor 110 (e.g., when the control node 140 is at a lower voltage than the bulk node 145), electrons may leave the charge trapping structure 120. Removal of electrons from the charge trapping structure 120 may be referred to as erasing the memory cell 105 and may occur as part of an erase operation. An erased memory cell may, in some cases, be considered as storing a logic 1. In some cases, memory cells 105 may be programmed at a page level of granularity due to memory cells 105 of a page sharing a common word line 165, and memory cells 105 may be erased at a block level of granularity due to memory cells 105 of a block sharing commonly biased bulk nodes 145.

In contrast to writing an SLC memory cell 105, writing a multiple-level (e.g., MLC, TLC, or QLC) memory cell 105 may involve applying different voltages to the memory cell 105 (e.g., to the control node 140 or bulk node 145 thereof) at a finer level of granularity to more finely control the amount of charge stored on the charge trapping structure 120, thereby enabling a larger set of logic values to be represented. Thus, multiple-level memory cells 105 may provide greater density of storage relative to SLC memory cells 105 but may, in some cases, involve narrower read or write margins or greater complexities for supporting circuitry.

A charge-trapping NAND memory cell 105 may operate similarly to a floating-gate NAND memory cell 105 but, instead of or in addition to storing a charge on a charge trapping structure 120, a charge-trapping NAND memory cell 105 may store a charge representing a logic state in a dielectric material between the control gate 115 and a channel (e.g., between a first node 130 and a second node 135). Thus, a charge-trapping NAND memory cell 105 may include a charge trapping structure 120, or may implement charge trapping functionality in one or more portions of dielectric material 125, among other configurations.

In some examples, each page of memory cells 105 may be connected to a corresponding word line 165, and each column of memory cells 105 may be connected to a corresponding bit line 155 (e.g., digit line). Thus, one memory cell 105 may be located at the intersection of a word line 165 and a bit line 155. This intersection may be referred to as an address of a memory cell 105. In some cases, word lines 165 and bit lines 155 may be substantially perpendicular to one another, and may be generically referred to as access lines or select lines.

In some cases, a memory device 100 may include a three-dimensional (3D) memory array, where multiple two-dimensional (2D) memory arrays may be formed on top of one another. In some examples, such an arrangement may increase the quantity of memory cells 105 that may be fabricated on a single die or substrate as compared with 1D arrays, which, in turn, may reduce production costs, or increase the performance of the memory array, or both. In the example of FIG. 1, memory device 100 includes multiple levels (e.g., decks, layers, planes, tiers) of memory cells 105. The levels may, in some examples, be separated by an electrically insulating material. Each level may be aligned or positioned so that memory cells 105 may be aligned (e.g., exactly aligned, overlapping, or approximately aligned) with one another across each level, forming a memory cell stack 175. In some cases, memory cells aligned along a memory cell stack 175 may be referred to as a string of memory cells 105 (e.g., as described with reference to FIG. 2).

Accessing memory cells 105 may be controlled through a row decoder 160 and a column decoder 150. For example, the row decoder 160 may receive a row address from the memory controller 180 and activate an appropriate word line 165 based on the received row address. Similarly, the column decoder 150 may receive a column address from the memory controller 180 and activate an appropriate bit line 155. Thus, by activating one word line 165 and one bit line 155, one memory cell 105 may be accessed. Upon accessing, a memory cell 105 may be read (e.g., sensed) by sense component 170. For example, the sense component 170 may be configured to determine the stored logic value of a memory cell 105 based on a signal generated by accessing the memory cell 105. The signal may include a current, a voltage, or both a current and a voltage on the bit line 155 for the memory cell 105 and may depend on the logic value stored by the memory cell 105. The sense component 170 may include various circuitry (e.g., transistors, amplifiers) configured to detect and amplify a signal (e.g., a current or voltage) on a bit line 155. The logic value of memory cell 105 as detected by the sense component 170 may be output via input/output component 190. In some cases, a sense component 170 may be a part of a column decoder 150 or a row decoder 160, or a sense component 170 may otherwise be connected to or in electronic communication with a column decoder 150 or a row decoder 160.

A memory cell 105 may be programmed or written by activating the relevant word line 165 and bit line 155 to enable a logic value (e.g., representing one or more bits of information) to be stored in the memory cell 105. A column decoder 150 or a row decoder 160 may accept data (e.g., from the input/output component 190) to be written to the memory cells 105. In the case of NAND memory, a memory cell 105 may be written by storing electrons in a charge trapping structure or an insulating layer.

A memory controller 180 may control the operation (e.g., read, write, re-write, refresh) of memory cells 105 through the various components (e.g., row decoder 160, column decoder 150, sense component 170). In some cases, one or more of a row decoder 160, a column decoder 150, and a sense component 170 may be co-located with a memory controller 180. A memory controller 180 may generate row and column address signals in order to activate a desired word line 165 and bit line 155. In some examples, a memory controller 180 may generate and control various voltages or currents used during the operation of memory device 100.

In some techniques for manufacturing a memory device 100 (e.g., for manufacturing a memory die that includes one or more aspects of the memory device 100), one or more materials may be deposited over a semiconductor substrate and portions of the one or more materials may be removed in accordance with various patterning operations. For example, a pattern of cavities may be formed by removing materials along a thickness direction in accordance with a pattern of openings having various cross-sectional profiles (e.g., circular cross-sections, elliptical cross-sections, polygonal cross-sections), and trenches may be formed by removing materials along the thickness direction in accordance with openings having relatively elongated profiles (e.g., an elongated rectangular profile, a linear profile, a boundary profile between or enclosing remaining portions of materials). In some examples, memory cells may be formed at least in part by depositing one or more storage materials in cavities, and trenches may be used to isolate regions of a memory array (e.g., to isolate blocks of memory cells based at least in part on depositing a dielectric material in associated trenches).

In some examples, material removal operations may be associated with a taper along a direction of material removal (e.g., along a thickness direction). For example, relatively deeper portions of cavities may be associated with a smaller cross-section than relatively shallower portions of the cavities (e.g., a cross section of a cavity opening), and relatively deeper portions of trenches may be associated with a smaller separation between trench walls than relatively shallower portions of the trenches (e.g., a separation between walls at a trench opening). In some examples, forming trenches may be associated with a greater degree of taper than forming cavities, which may have a greater effect on memory die layout with large aspect ratios (e.g., a ratio of depth of material removal to width of a material removal opening, a ratio between height and width of associated structures). For example, a greater taper of trenches may lead to adverse physical characteristics of a memory die, such as misalignment between trenches and memory structures (e.g., an overlap between trenches and cavities), structural defects (e.g., block-bending), poor process margins (e.g., tolerances), and increased process costs, particularly as aspect ratios grow with a scaling of memory dies along a thickness direction (e.g., relative to a substrate).

In accordance with examples as disclosed herein, trenches of a memory die included in a memory device 100 may be formed by merging patterns of cavities, reducing a degree of taper compared to forming each trench by removing material in accordance with a single elongated opening. For example, a row of cavities may be formed using a cavity etching process and material separating cavities of the row may be removed (e.g., in a selective etching operation) to merge the row of cavities, forming a trench. In some cases, a trench may be formed from multiple rows of cavities. Additionally, or alternatively, a trench may be formed from a pattern of cavities that includes different quantities of rows at different locations along the trench. Because cavities may be associated with a smaller degree of taper than trenches formed in accordance with a single elongated opening, trenches formed by merging a pattern of cavities may also be associated with a smaller degree of taper. Accordingly, such techniques support fewer misalignments between trenches and memory structures, fewer structural defects, improved process margins, and reduced process costs. In some examples, process margins may be further improved by forming etch stopping material portions (e.g., etch stops) at locations corresponding to cavities prior to a cavity etching process. For example, exposed material surfaces at locations corresponding to cavities or trenches may be oxidized to form etch stops, improving the accuracy of the subsequent etching process.

FIG. 2 illustrates an example of a memory architecture 200 that supports merged cavities and buried etch stops for three-dimensional memory arrays in accordance with examples as disclosed herein. The memory architecture 200 may be an example of a portion of a memory device, such as a memory device 100. Although some elements of a set of elements (e.g., an array of elements) are included in FIG. 2, some elements may be omitted for the sake of visibility and clarity of the depicted elements. Moreover, although some elements included in FIG. 2 are labeled with reference numbers, some other corresponding elements are not labeled, though they are the same or would be understood by a person of ordinary skill in the art to be similar. Aspects of the memory architecture 200 may be described with reference to an x-direction, a y-direction, and a z-direction of the illustrated coordinate system.

The memory architecture 200 includes a three-dimensional array of memory cells 205, which may be examples of memory cells 105 described with reference to FIG. 1 (e.g., transistors 110, NAND memory cells). In some examples, the memory cells 205 may be connected in a 3D NAND configuration. For example, the memory cells 205 may be included in a block 210, which may be arranged as a 3D array of m memory cells along the x-direction, n memory cells along the y-direction, and o memory cells along the z-direction. Each memory cell 205 may be located (e.g., addressed) in accordance with an index i along the x-direction, an index j along the y-direction, and an index k along the z-direction (e.g., for locating a memory cell 205-*a*-*ijk*). A memory device 100 may include any quantity of one or more blocks 210 in accordance with examples as disclosed herein, and different blocks 210 may be adjacent along the x-direction, along the y-direction, or along the z-direction, or any combination thereof.

In the example of memory architecture 200, the block 210 may be divided into a set of pages 215 (e.g., a quantity of o pages 215) along the z-direction, including a page 215-*a*-1 associated with memory cells 205-*a*-111 through 205-*a*-*mnl*. In some examples, each reference to FIG. 1), which may be coupled with a control gate 115 of each of the memory cells 205 of the page 215. For example, page 215-*a*-1 may be associated with a word line 265-*a*-1, and other pages 215-*a*-*i* may be associated with a different respective word line 265-*a*-*i* (not shown). In some examples, a word line 265 in accordance with the memory architecture 200 may be implemented as planar conductor (e.g., in an xy-plane) that is coupled with each of the memory cells 205 of the page 215.

In the example of memory architecture 200, the block 210 also may be divided into a set of strings 220 (e.g., a quantity of (m×n) strings 220) in an xy-plane, including a string 220-*a*-*mn* associated with memory cells 205-*a*-*mnl* through 205-*a*-*mno*. In some examples, each string 220 may include a set of memory cells 205 connected in series (e.g., along the z-direction, in which a drain of one memory cell 205 in the string 220 may be coupled with a source of another memory cell 205 in the string 220). In some examples, memory cells 205 of a string 220 may be implemented along a common channel, such as a pillar channel (e.g., a columnar channel, a pillar of doped semiconductor) along the z-direction. Each memory cell 205 in a string 220 may be associated with a different word line 265, such that a quantity of word lines 265 in the memory architecture 200 may be equal to the quantity of memory cells 205 in a string 220. Accordingly, a string 220 may include memory cells 205 from multiple pages 215, and a page 215 may include memory cells 205 from multiple strings 220.

In some examples, memory cells 205 may be programmed (e.g., set to a logic 0 value) and read from a granularity, such as the granularity of the page 215, but may not be erasable (e.g., reset to a logic 1 value) at the granularity, such as the granularity of the page 215. For example, NAND memory may instead be erasable at a different (e.g., higher) level of granularity, such as at the level of granularity the block 210. In some cases, a memory cell 205 may be erased before it may be re-programmed. Different memory devices may have different read, write, or erase characteristics.

In some examples, each string 220 of the block 210 may be coupled with a respective transistor 230 (e.g., a string select transistor, a drain select transistor) at one end of the string 220 (e.g., along the z-direction) and a respective transistor 240 (e.g., a source select transistor, a ground select transistor) at the other end of the string 220. In some examples, a drain of each transistor 230 may be coupled with a bit line 250 of a set of bit lines 250 associated with the block 210, where the bit lines 250 may be examples of bit lines 155 described with reference to FIG. 1. A gate of each transistor 230 may be coupled with a select line 235 (e.g., a string select line, a drain select line). Thus, a transistor 230 may be used to couple a string 220 with a bit line 250 based on applying a voltage to the select line 235, and thus to the gate of the transistors 230. Although illustrated as separate lines along the x-direction, in some examples, select lines 235 may be common to all the transistors 230 associated with the block 210 (e.g., a commonly biased string select node). For example, like the word lines 265 of the block 210, select lines 235 associated with the block 210 may, in some examples, be implemented as a planar conductor (e.g., in an xy-plane) that is coupled with each of the transistors 230 associated with the block 210.

In some examples, a source of each transistor 240 associated with the block 210 may be coupled with a source line 260 of a set of source lines 260 associated with the block 210. In some examples, the set of source lines 260 may be associated with a common source node (e.g., a ground node) corresponding to the block 210. A gate of each transistor 240 may be coupled with a select line 245 (e.g., a source select line, a ground select line). Thus, a transistor 240 may be used to couple a string 220 with a source line 260 based on applying a voltage to the select line 245, and thus to the gate of the transistors 240. Although illustrated as separate lines along the x-direction, in some examples, select lines 245 also may be common to all the transistors 240 associated with the block 210 (e.g., a commonly biased ground select node). For example, like the word lines 265, select lines 245 associated with the block 210 may, in some examples, be implemented as a planar conductor (e.g., in an xy-plane) that is coupled with each of the transistors 240 associated with the block 210.

To operate the memory architecture 200 (e.g., to perform a program operation, a read operation, or an erase operation on one or more memory cells 205 of the block 210), various voltages may be applied to one or more select lines 235 (e.g., to the gate of the transistors 230), to one or more bit lines 250 (e.g., to the drain of one or more transistors 230), to one or more word lines 265, to one or more select lines 245 (e.g., to the gate of the transistors 240), to one or more source lines 260 (e.g., to the source of the transistors 240), or to a bulk for the memory cells 205 (not shown) of the block 210. In some cases, each memory cell 205 of a block 210 may have a common bulk, the voltage of which may be controlled independently of bulks for other blocks 210.

In some cases, as part of a read operation for a memory cell 205, a positive voltage may be applied to the corresponding bit line 250 while the corresponding source line 260 may be grounded or otherwise biased at a voltage lower than the voltage applied to the bit line 250. In some examples, concurrently, voltages may be applied to the select line 235 and the select line 245 that are above the threshold voltages of the transistor 230 and the transistor 240, respectively, for the memory cell 205, thereby activating the transistor 230 and transistor 240 such that a channel associated with the string 220 that includes the memory cell 205 may be electrically connected to the corresponding bit line 250 and the source line 260. A channel may be an electrical path through the memory cells 205 in the string 220 (e.g., through the sources and drains of the transistors in the memory cells 205 of the string 220) that may conduct current under some operating conditions.

In some examples, concurrently, multiple word lines 265 (e.g., in some cases all word lines 265) of the block 210—except a word line 265 associated with a page 215 of the memory cell 205 to be read—may be set to a voltage (e.g., VREAD) that is higher than the threshold voltage (VT) of the memory cells 205. VREAD may cause all memory cells 205 in the unselected pages 215 be activated so that each unselected memory cell 205 in the string 220 may maintain high conductivity within the channel. In some examples, the word line 265 associated with the memory cell 205 to be read may be set to a voltage, VTarget. Where the memory cells 205 are operated as SLC memory cells, VTarget may be a voltage that is between (i) VT of a memory cell 205 in an erased state and (ii) VT of a memory cell 205 in a programmed state.

When the memory cell 205 to be read exhibits an erased VT (e.g., VTarget>VT of the memory cell 205), the memory cell 205 may turn "ON" in response to the application of VTarget to the word line 265 of the selected page 215, which may allow a current to flow in the channel of the string 220, and thus from the bit line 250 to the source line 260. When the memory cell 205 to be read exhibits a programmed VT (e.g., VTarget<VT of the selected memory cell), the memory cell 205 may remain "OFF" despite the application of VTarget to the word line 265 of the selected page 215, and thus may prevent a current from flowing in the channel of the string 220, and thus from the bit line 250 to the source line 260.

A signal on the bit line 250 for the memory cell 205 (e.g., an amount of current below or above a threshold) may be sensed (e.g., by a sense component 170 as described with reference to FIG. 1), and may indicate whether the memory cell 205 became conductive or remained non-conductive in response to the application of VTarget to the word line 265 of the selected page 215. The sensed signal thus may be indicative of whether the memory cell 205 was in an erased state (e.g., storing a logic 1) or a programmed state (e.g., storing a logic Though aspects of the example read operation above have been explained in the context of an SLC memory cell 205 for clarity, such techniques may be extended or altered and applied in the context of a multiple-level memory cell 205 (e.g., through the use of multiple values of VTarget corresponding to the different amounts of charge that may be stored in one multiple-level memory cell 205).

In some cases, as part of a program operation for a memory cell 205, charge may be added to a portion of the memory cell 205 such that current flow through the memory cell 205, and thus the corresponding string 220, may be inhibited when the memory cell 205 is later read. For example, charge may be injected into a charge trapping structure 120 as shown in memory cell 105-a of FIG. 1. In some cases, respective voltages may be applied to the word line 265 of the page 215 and the bulk of the memory cell 205 to be programmed such that a control gate 115 of the memory cell 205 is at a higher voltage than the bulk of the memory cell 205 (e.g., a positive voltage may be applied to the word line). Concurrently, voltages may be applied to the select line 235 and the select line 245 that are above the threshold voltages of the transistor 230 and the transistor 240, respectively, thereby activating the transistor 230 and the transistor 240, and the bit line 250 for the memory cell 205 to be programmed may be set to a relatively high voltage. This may cause an electric field such that electrons are pulled from the source of the memory cell 205 towards the drain. The electric field may also cause some of these electrons to be pulled through dielectric material 125 and thereby injected into the charge trapping structure 120 of the memory cell 205, through a process which may in some cases be referred to as tunnel injection.

In some cases, a single program operation may program some or all memory cells 205 in a page 215, as the memory cells 205 of the page 215 may all share a common word line 265 and a common bulk. For a memory cell 205 of the page 215 for which it is not desired to write a logic 0 (e.g., not desired to program the memory cell 205), the corresponding bit line 250 may be set to a relatively low voltage (e.g., ground), which may inhibit the injection of electrons into a charge trapping structure 120. Though aspects of the example program operation above have been explained in the context of an SLC memory cell 205 for clarity, such techniques may be extended and applied to the context of a multiple-level memory cell 205 (e.g., through the use of multiple programming voltages applied to the word line 265, or multiple passes or pulses of a programming voltage applied to the word line 265, corresponding to the different amounts of charge that may be stored in one multiple-level memory cell 205).

In some cases, as part of an erase operation for a memory cell 205, charge may be removed from a portion of the memory cell 205 such that current flow through the memory cell 205, and thus the corresponding string 220, may be uninhibited (e.g., allowed, at least to a greater extent) when the memory cell 205 is later read. For example, charge may be removed from a charge trapping structure 120 as shown in memory cell 105-a of FIG. 1. In some cases, respective voltages may be applied to the word line 265 of the page 215 and the bulk of the memory cell 205 to be erased such that a control gate 115 of the memory cell 205 is at a lower voltage than the bulk of the memory cell 205 (e.g., a positive voltage may be applied to the bulk), which may cause an electric field that pulls electrons out of the charge trapping structure 120 and into the bulk of the memory cell 205. In some cases, a single program operation may erase all memory cells 205 in a block 210, as the memory cells 205 of the block 210 may all share a common bulk.

In some cases, electron injection and removal processes associated with program and erase operations may cause stress on a memory cell 205 (e.g., on the dielectric material 125). Over time, such stress may in some cases cause one or more aspects of the memory cell 205 (e.g., the dielectric material 125) to deteriorate. For example, a charge trapping structure 120 may become unable to maintain a stored charge. Such deterioration may be an example of a wear-out mechanism for a memory cell 205, and for this or other reasons, some memory cells 205 may support a finite quantity of program and erase cycles.

In some techniques for manufacturing the memory architecture 200, one or more materials may be deposited over a semiconductor substrate and portions of the one or more materials may be removed in accordance with various patterning operations. For example, a pattern of cavities may be formed by removing materials along a thickness direction (e.g., along the z-direction) in accordance with a pattern of openings having various cross-sectional profiles (e.g., circular cross-sections, elliptical cross-sections, polygonal cross-sections, cross-sections in an xy-plane), and trenches may be formed by removing materials along a thickness direction in accordance with openings having relatively elongated profiles (e.g., an elongated rectangular profile, a linear profile, a boundary profile between or enclosing remaining portions of materials, a profile along the x-direction, along the y-direction, or otherwise elongated in an xy-plane). In some examples, memory cells 205 may be formed at least in part by depositing one or more storage materials in cavities, and trenches may be used to isolate regions of a memory array (e.g., to isolate features of blocks 210 from one another, based at least in part on depositing a dielectric material in associated trenches).

In some examples, material removal operations may be associated with a taper along a direction of material removal (e.g., along the z-direction). For example, relatively deeper portions of cavities may be associated with a smaller cross-section (e.g., in an xy-plane) than relatively shallower portions of the cavities (e.g., a cross section of a cavity opening), and relatively deeper portions of trenches may be associated with a smaller separation between trench walls (e.g., along the x-direction, along the y-direction, or otherwise along a direction in an xy-plane) than relatively shallower portions of the trench (e.g., a separation between walls at a trench opening). In some examples, forming trenches may be associated with a greater degree of taper than forming cavities, which may have a greater effect on aspects of the memory architecture 200 with large aspect ratios (e.g., a ratio of depth of material removal to width of a material removal opening, a ratio between height and width of associated structures). For example, a greater taper of trenches may lead to adverse physical characteristics of the memory architecture 200, such as misalignment between trenches and memory structures (e.g., an overlap between trenches and cavities), structural defects (e.g., block-bending), poor process margins (e.g., tolerances), and increased process costs, particularly as aspect ratios grow with a scaling of memory dies along the thickness direction.

In accordance with examples as disclosed herein, trenches used to form the memory architecture 200 may be formed by merging patterns of cavities, which may reduce a degree of taper compared to forming each trench by removing material in accordance with a single elongated opening. For example, a row of cavities (e.g., along the x-direction, along the y-direction) may be formed using a cavity etching process and material separating cavities of the row may be removed (e.g., in a selective etching operation) to merge the row of cavities, forming a trench. In some cases, a trench may be formed from multiple rows of cavities. Additionally, or alternatively, a trench may be formed from a pattern of cavities that includes different quantities of rows at different locations along the trench. Because cavities may be associated with a smaller degree of taper than trenches formed in accordance with a single elongated opening, trenches formed by merging a pattern of cavities may also be associated with a smaller degree. Accordingly, such techniques may support fewer misalignments between trenches and memory structures, fewer structural defects, improved process margins, and reduced process costs. In some examples, process margins may be further improved by forming etch stopping material portions (e.g., etch stops) at locations corresponding to cavities prior to a cavity etching process. In some examples, exposed material surfaces at the locations corresponding to the cavities may be selectively oxidized to form etch stops, improving the accuracy of the subsequent cavity etching process.

FIGS. 3 through 26 illustrate examples of fabrication operations that may support merged cavities and buried etch stops for three-dimensional memory arrays in accordance with examples as disclosed herein. For example, FIGS. 3 through 26 may illustrate aspects of a sequence of operations for fabricating aspects of a material arrangement 300, which may be an example of implementing aspects of a memory architecture 200 described with reference to FIG. 2. Each of FIGS. 3 through 26 may illustrate aspects of the material arrangement 300 after different subsets of or alternatives of the fabrication operations for forming the material arrangement 300 (e.g., illustrated as a material arrangement 300-a after a first set of one or more manufacturing operations, as a material arrangement 300-b after a second set of one or more manufacturing operations, and so on). Each view of the figures may be described with reference to an x-direction, a y-direction, and a z-direction as illustrated, which may correspond to the respective directions described with reference to the memory architecture 200.

Some of the provided figures include section views that illustrate example cross-sections of the material arrangement 300. For example, in FIGS. 3 through 26, a view "SECTION A-A" may be associated with a cross-section in an x'y'-plane (e.g., in accordance with a cut plane A-A, which may be associated with an x'y'z coordinate system rotated about the z-direction relative to the xyz coordinate system) through a portion of the material arrangement 300 associated with one or more cavities (e.g., including at least one cavity for a memory cell 205), and a view "SECTION B-B" may be associated with a cross-section in a yz-plane (e.g., in accordance with a cut plane B-B) through a portion of the material arrangement 300 that is associated with (e.g., aligned along) a trench. Although the material arrangement 300 illustrates examples of certain relative dimensions and quantities of various features, aspects of the material arrangement 300 may be implemented with other relative dimensions or quantities of such features in accordance with examples as disclosed herein.

Operations illustrated in and described with reference to FIGS. 3 through 26 may be performed by a manufacturing system, such as a semiconductor fabrication system configured to perform additive operations such as deposition or bonding, subtractive operations such as etching, trenching, planarizing, or polishing, and supporting operations such as masking, patterning, photolithography, or aligning, among other operations that support the described techniques. In some examples, operations performed by such a manufacturing system may be supported by a process controller or its components as described herein.

Figure 3:
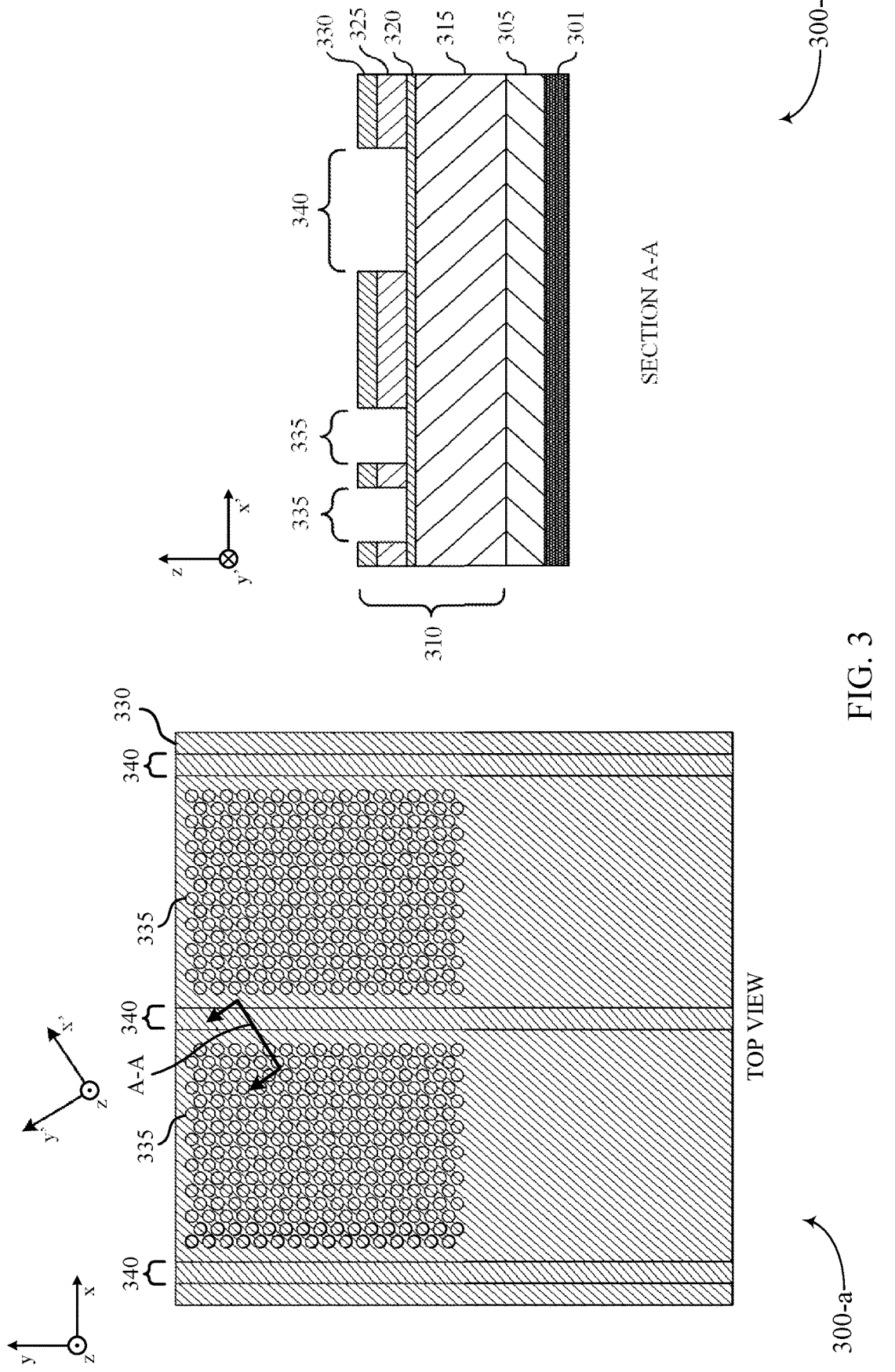

FIG. 3 illustrates the material arrangement 300 (e.g., as a material arrangement 300-a) after a first set of one or more manufacturing operations. The first set of operations may include forming a layer of a material 305 (e.g., depositing the material 305 over a substrate 301), which may include a conductive material (e.g., a metal, a metal alloy, an electrically conductive ceramic such as tungsten silicide). In some examples, the layer of material 305 may support a ground node of memory architecture 200, such as a source node of one or more blocks 210 (e.g., source lines 260, a common source). Although the layer of material 305 may be deposited in contact with the substrate 301, in some other examples, the material arrangement 300 may include other materials or components between the layer of material 305 and the substrate 301, such as interconnection or routing circuitry (e.g., access lines, power routing lines), control circuitry (e.g., transistors, logic, decoder circuitry, aspects of a memory controller 180, a column decoder 150, a row decoder 160, a sense component 170, an input/output component 190), among other circuitry, which may include various conductor, semiconductor, or dielectric materials between the layer of material 305 and the substrate 301. For example, the material arrangement 300 may include a layer including thin-film-transistors (TFT) between the substrate 301 and the layer of material 305, among others. In some examples, the substrate 301 itself may include such interconnection or routing circuitry.

The first set of operations may also include depositing a stack of layers 310 (e.g., a first stack) over the substrate 301 (e.g., over the layer of material 305. The stack of layers 310 may include a layer of a material 315, a layer of a material 320, a layer of a material 325, and a layer of a material 330. In some examples, the material 315 may be a semiconductor material (e.g., doped polysilicon, n+ doped polysilicon), which may support forming a channel portion of transistors 240. In some examples, each of the material 320, the material 325, and the material 330 may be a sacrificial material that is patterned and removed in later processing operations, and each may be selected to support various techniques for differential processing (e.g., differential etching, high selectivity). For example, the material 320 may be a dielectric material (e.g., an oxide, an oxide of silicon, a liner oxide), the material 325 may be a semiconductor material (e.g., polysilicon), and the material 330 may be a dielectric material (e.g., an oxide, an oxide of silicon, a cap oxide), which may be the same as the material 320.

The first set of operations may also include operations (e.g., etching operations, photolithography operations) that support forming cavities 335 (e.g., first cavities) and trenches 340 (e.g., first trenches), which may include operations that form the cavities 335 and the trenches 340 concurrently. For example, the first set of manufacturing operations may include depositing a masking material (e.g., a hardmask), not shown, over the stack of layers 310. In some cases, the masking material may be deposited in a pattern (e.g., as viewed in an xy-plane), where the masking material does not cover locations at which cavities 335 and trenches 340 will be formed. In some examples, the first set of manufacturing operations may then include forming the cavities 335 and the trenches 340 based on etching through the material 330 and the material 325 (e.g., exposing sidewalls of the material 330 and the material 325, exposing surfaces of the material 320 in an xy-plane, via an etching operation, such as a dry etching operation, a photolithography operation), where portions of the material 330 and the material 325 are removed at locations not covered by the masking material. The trenches 340 may have openings that are relatively elongated (e.g., along the y-direction), and may be connected with each other along the x-direction (not shown) to provide a trench isolation around each portion of the material arrangement 300 that is associated with a block 210 (e.g., where trenches 340 may enclose a block 210). The cavities 335 and the trenches 340 may be relatively shallow (e.g., having a relatively small aspect ratio, in comparison to cavities and trenches formed in subsequent material removal operations), such that tapering associated with forming the cavities 335 or the trenches 340 may be less significant than tapering associated with other features formed in later operations (e.g., with greater aspect ratios).

Figure 4:
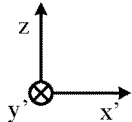
Figure 4:
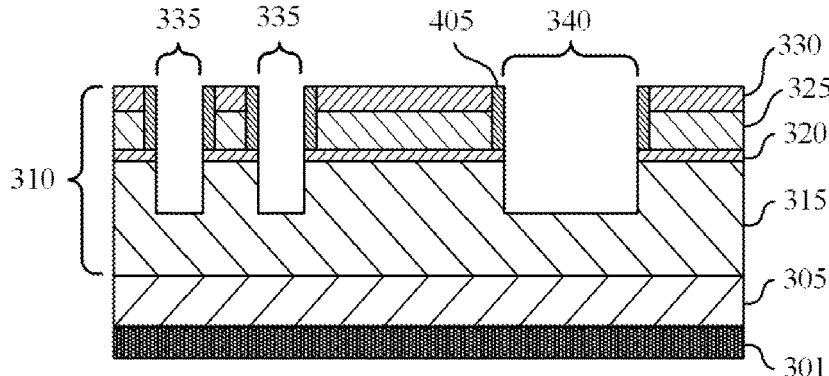
Figure 4:
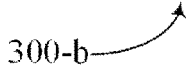

FIG. 4 illustrates the material arrangement 300 (e.g., as a material arrangement 300-b) after a second set of one or more manufacturing operations, as a cross-sectional side view (e.g., relative to the cut plane A-A). The second set of operations may include further operations (e.g., a nitride deposition operation, an etching operation) that support forming the cavities 335 and the trenches 340. For example, the second set of manufacturing operations may include depositing a material 405 (e.g., a liner material, a nitride material, a nitride of silicon) on exposed surfaces of the cavities 335 and exposed surfaces of the trenches 340 (e.g., sidewalls, bottom surfaces). In some cases, the second set of operations may also include a material removal operation (e.g., dry etch operation aligned with the cavities 335 and trenches 340), where a portion of the material 405 (e.g., a portion in contact with the material 320), a portion of the material 320, and a portion of the material 315 is removed from (e.g., along a direction of) the cavities 335 and the trenches 340, thereby extending the cavities 335 and trenches 340 along the z-direction (e.g., forming cavities 335 and trenches 340 using multiple concurrent material removal operations). Thus, the second set of operations may include operations that expose sidewalls of the material 320, and sidewalls and a bottom surface of the material 315, associated with the cavities 335 and the trenches 340.

Figure 5:
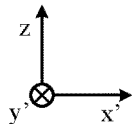
Figure 5:
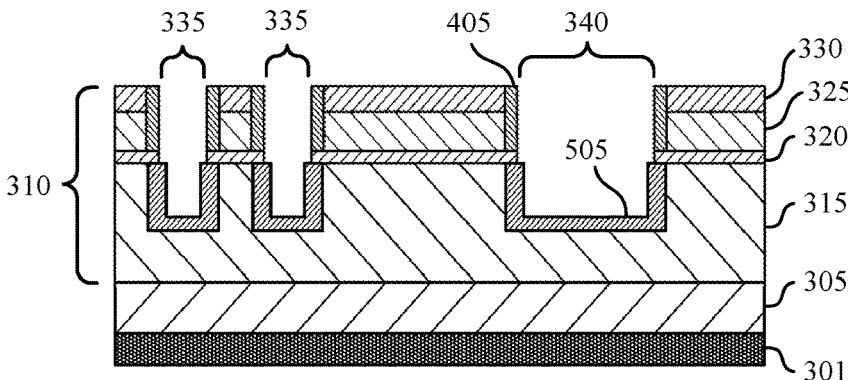
Figure 5:
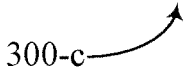

FIG. 5 illustrates the material arrangement 300 (e.g., as a material arrangement 300-c) after a third set of one or more manufacturing operations, as a cross-sectional side view (e.g., relative to the cut plane A-A). The third set of manufacturing operations may include operations (e.g., an oxidation operation) that support forming features in the cavities 335 and the trenches 340. For example, the third set of manufacturing operations may include oxidizing the material 315 (e.g., exposed surfaces of the material 315) to form a material 505 (e.g., oxidized doped polysilicon), which may support subsequent aspects of differential processing. In some examples, the material 405 may cover the surface of the material 325 (e.g., a sacrificial polysilicon), such the material 325 is not oxidized.

Figure 6:
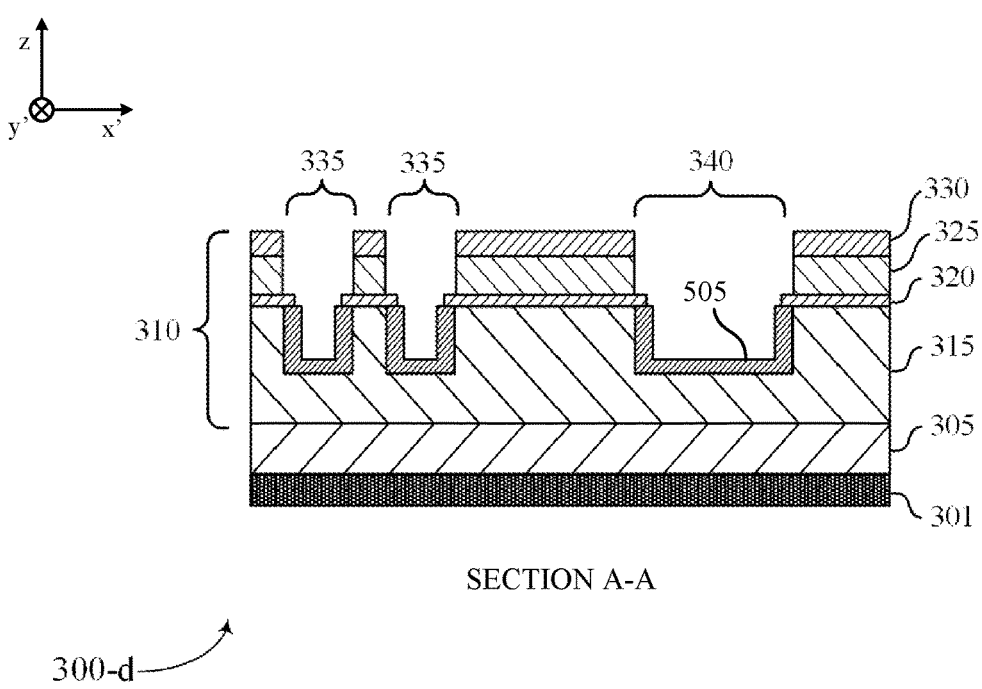

FIG. 6 illustrates the material arrangement 300 (e.g., as a material arrangement 300-d) after a fourth set of one or more manufacturing operations, as a cross-sectional side view (e.g., relative to the cut plane A-A). The fourth set of manufacturing operations may include further operations (e.g., an etching operation, a wet etching operation) that support forming features in the cavities 335 and the trenches 340. For example, the fourth set of manufacturing operations may include removing the material 405 from the cavities 335 and the trenches 340, which may expose sidewalls of the material 325 and the material 330 associated with the cavities 335 and the trenches 340.

Figure 7:
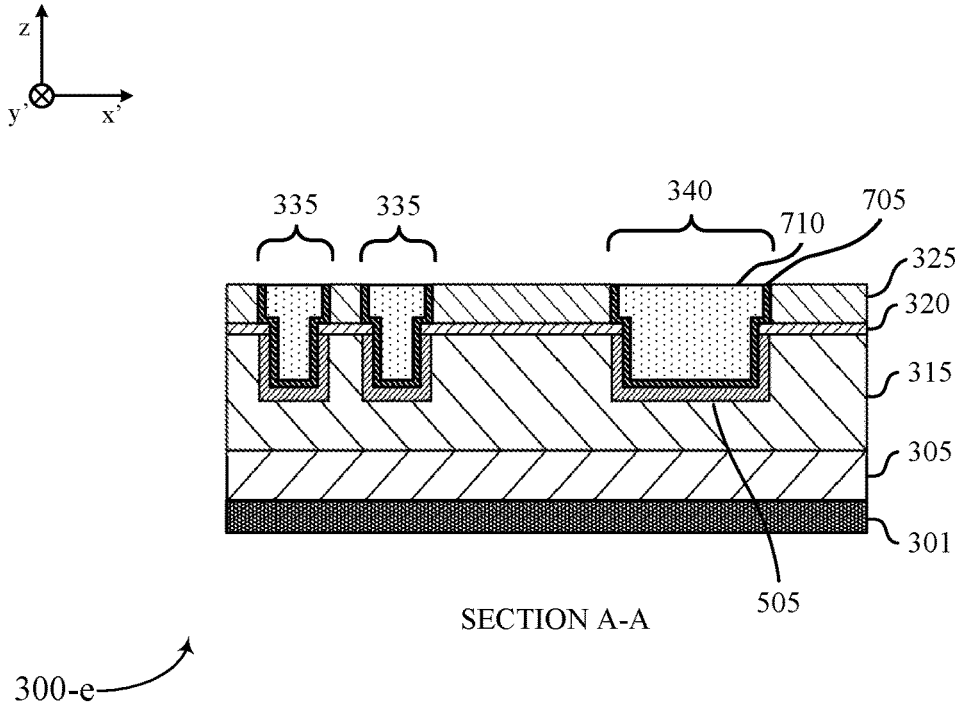

FIG. 7 illustrates the material arrangement 300 (e.g., as a material arrangement 300-e) after a fifth set of one or more manufacturing operations, as a cross-sectional side view (e.g., relative to the cut plane A-A). The fifth set of operations may include operations (e.g., one or more deposition operations) that support forming a first set of first material portions (e.g., in the trenches 340) and a second set of first material portions (e.g., in the cavities 335). For example, the fifth set of manufacturing operations may include depositing one or more materials (e.g., one or more first materials) in the trenches 340 and the cavities 335 (e.g., concurrently). In some cases, the first material portions may include a material 705 and a material 710. The material 705 may include a liner material (e.g., titanium nitride), which may be deposited in contact with the exposed surfaces of the cavities 335 and the trenches 340. The material 710 may include another material (e.g., tungsten), and may be deposited in contact with the material 705. In some examples, the first material portions (e.g., the material 705, or the material 710, or both) may be examples of etch stopping features used in later operations.

The fifth set of operations may also include operations (e.g., planarizing operations) to flatten a top surface of the material arrangement 300-e, which may support aspects of subsequent operations. For example, the fifth set of operations may include removing the material 330 (e.g., via chemical mechanical polishing (CMP)), among other materials that may be present on a top surface of the material arrangement 300 (e.g., portions of the material 705 or the material 710).

Figure 8:
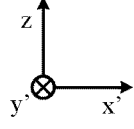
Figure 8:
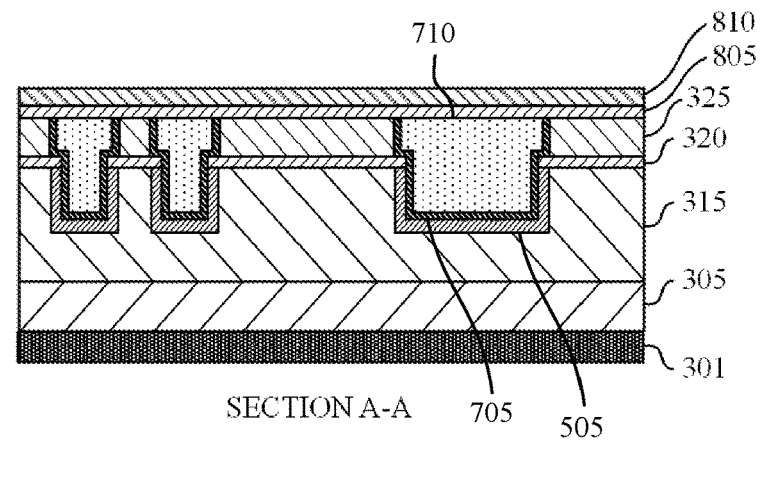

FIG. 8 illustrates the material arrangement 300 (e.g., as a material arrangement 300-f) after a sixth set of one or more manufacturing operations, as a cross-sectional side view (e.g., relative to the cut plane A-A). The sixth set of operations may include further operations (e.g., an oxide layer deposition operation, a polysilicon layer deposition) to build layers of the material arrangement 300. For example, the sixth set of operations may include depositing a layer of a material 805 and a layer of a material 810 (e.g., over remaining portions of the stack of layers 310, over the material 325, over a top surface of the material arrangement 300 as prepared by the fifth set of operations). The material 805 may be an oxide material (e.g., an oxide of silicon), and the material 810 may be a semiconductor material (e.g., polysilicon). In some examples, the material 805 may be a sacrificial material (e.g., removed in one or more later operations), and the material 810 may support formation of one or more transistor structures (e.g., as part of a channel of transistors 240 of the memory architecture 200).

Figure 9:
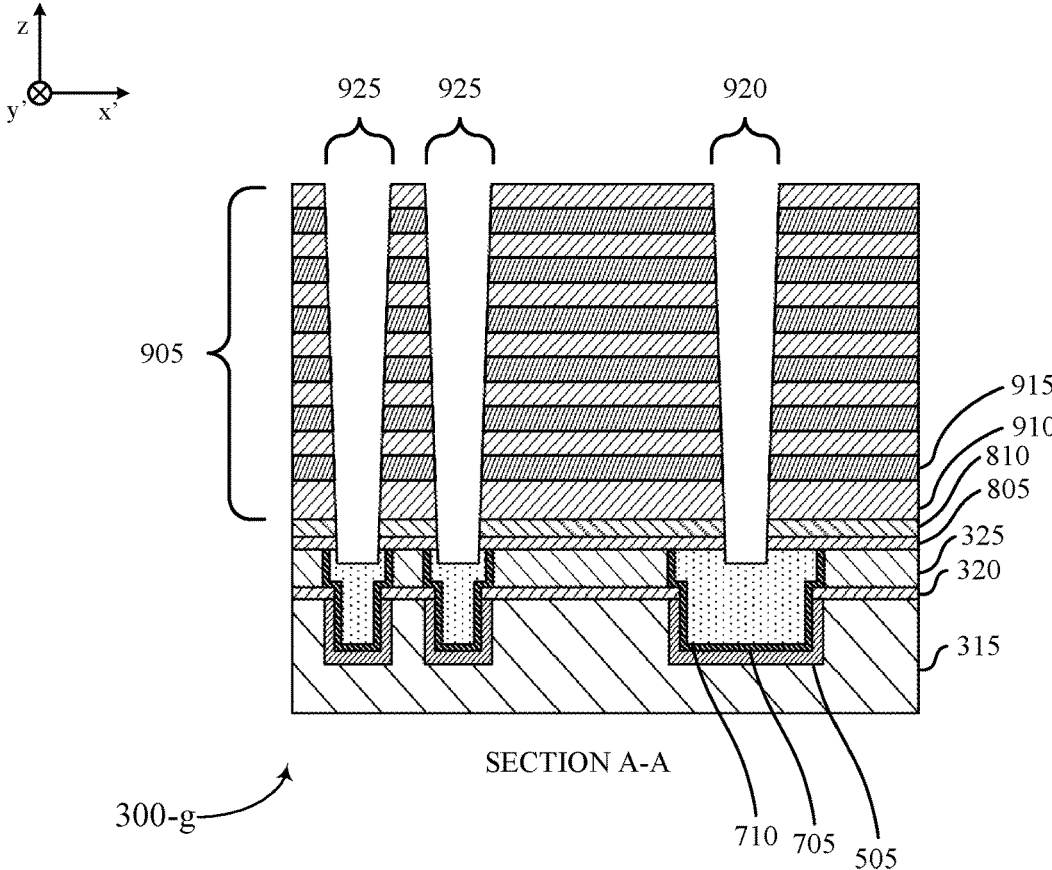

FIG. 9 illustrates the material arrangement 300 (e.g., as a material arrangement 300-g) after a seventh set of one or more manufacturing operations, as a cross-sectional side view (e.g., relative to the cut plane A-A). Although the substrate 301 and the layer of the material 305 are omitted from FIGS. 9-26, such features may remain in various examples of the material arrangement 300. The seventh set of operations may include operations that support depositing a second stack of material layers (e.g., as one or more deposition operations). For example, the seventh set of operations may include depositing a stack of layers 905 over the material 810. The stack of layers 905 may include alternating layers of a material 910 and a material 915 (e.g., in accordance with alternating material deposition operations). In some examples, the material 910 may include a dielectric material (e.g., an oxide, a tier oxide, an oxide of silicon), which may provide electrical isolation between other layers of the stack of layers 905 (e.g., between pages 215). The material 915 may include various materials that are different than the material 910 (e.g., a nitride material, a nitride of silicon), and may be an example of a sacrificial material (e.g., to support subsequent differential etching procedures). Although the stack of layers 905 is illustrated with thirteen layers (e.g., seven layers of the material 910 and six layers of the material 915), a stack of layers 905 in accordance with examples as disclosed herein may include any quantity of layers of each of two or more materials (e.g., tens of layers, hundreds of layers, and so on).

The seventh set of operations may also include operations (e.g., etching operations, photolithography operations) for forming cavities through the stack of layers 905. For example, the seventh set of operations may include forming cavities 920 (e.g., second cavities) through the stack of layers 905, where forming the cavities 920 may expose a portion of the material 710 (e.g., using the material 710 as a cavity etch stop or trench etch stop). The cavities 920 may be formed in a pattern (e.g., in rows, along the y-direction) at locations corresponding to the trenches 340. The seventh set of operations may also include forming cavities 925 (e.g., third cavities) through the stack of layers 905, where forming the cavities 925 may also expose a portion of the material 710 (e.g., using the material 710 as a cavity etch stop). The cavities 925 may be formed at locations corresponding to the cavities 335. The cavities 920 and the cavities 925 may be formed concurrently (e.g., using one or more common etching operations), and may be formed with a degree of taper associated with an etching operation (e.g., dry etching, RIE). In various examples, a degree of taper associated with the cavities 920 and cavities 925 may be less than a degree of forming a trench with an elongated opening (e.g., along the y-direction) and a similar depth of material removal (e.g., along the z-direction).

Figure 10:
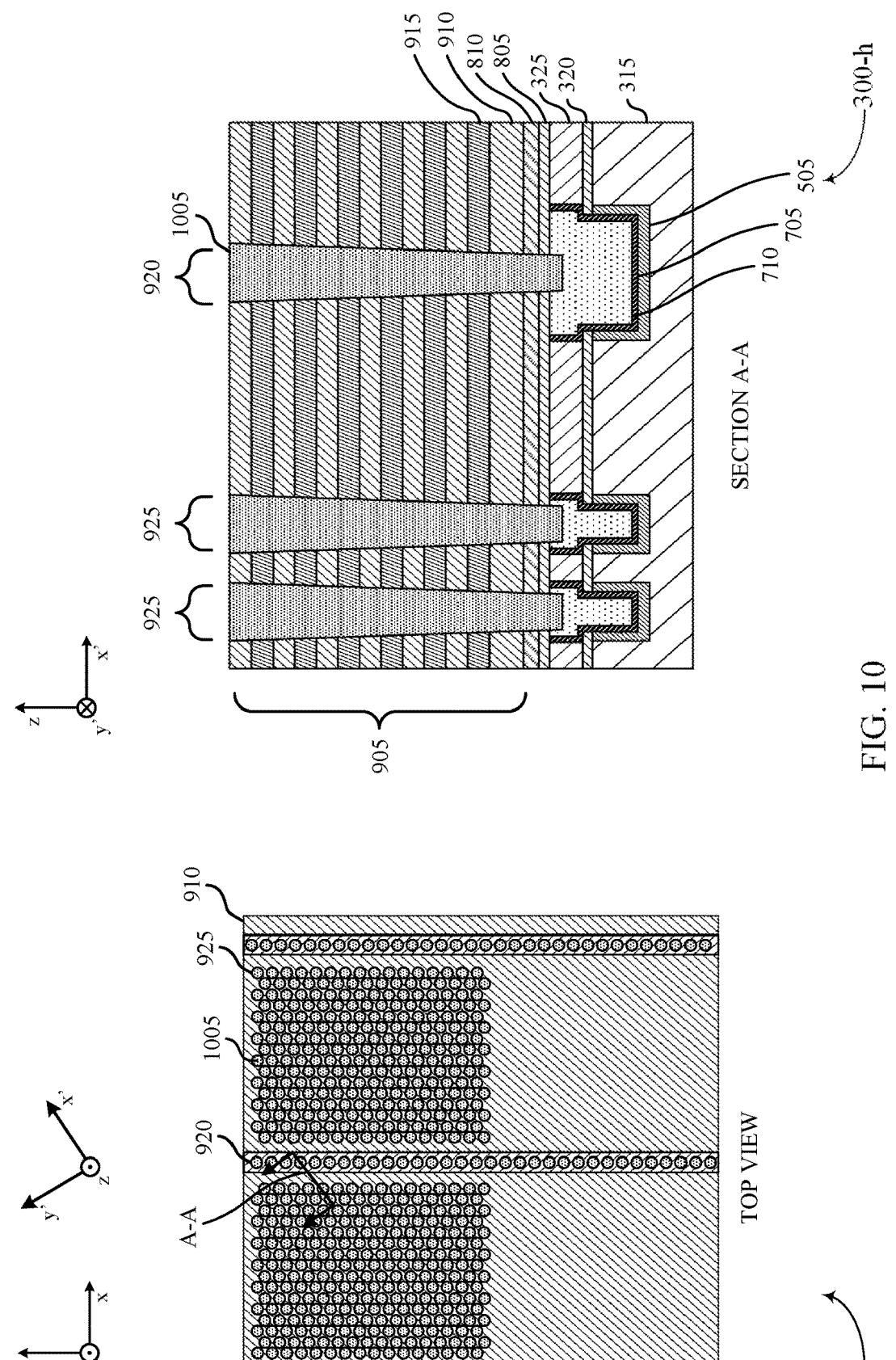

FIG. 10 illustrates the material arrangement 300 (e.g., as a material arrangement 300-h) after an eighth set of one or more manufacturing operations. The eighth set of operations may include operations (e.g., deposition operations) that support filling the cavities 920 and the cavities 925 (e.g., with a sacrificial material, to support subsequent operations). For example, the eighth set of operations may include depositing a material 1005 in the cavities 920 and the cavities 925. The material 1005 may include a sacrificial material (e.g., sacrificial carbon, with or without a liner material, or a stack of different materials). The eighth set of operations may also include operations (e.g., planarizing operations) to flatten a top surface of the material arrangement 300-*h* (e.g., via CMP), which may support aspects of subsequent operations.

Figure 11:
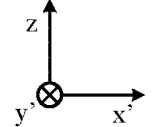

FIG. 11 illustrates the material arrangement 300 (e.g., as a material arrangement 300-*i*) after a ninth set of one or more manufacturing operations, as a cross-sectional side view (e.g., relative to the cut plane A-A). The ninth set of operations may include operations (e.g., one or more deposition operations, etching operations, photolithography operations) that support depositing additional material layers and forming cavities through the additional material layers (e.g., extending cavities 920 and cavities 925). For example, the ninth set of operations may include depositing a stack of layers 1105 on the stack of layers 905, where the stack of layers 1105 may include additional alternating layers of the material 910 and the material 915 (e.g., in accordance with alternating material deposition operations), The ninth set of operations may also include operations (e.g., etching operations, photolithography operations) for forming cavities through the stack of layers 1105. For example, the ninth set of operations may include forming cavities 1110 (e.g., third cavities) through the stack of layers 1105, where forming the cavities 1110 may expose a portion of the material 1005 (e.g., of cavities 920). Like the cavities 920, the cavities 1110 may be formed in a pattern (e.g., a row) at locations corresponding to the trenches 340 and, in some examples, a cavity 1110 may be aligned with a respective cavity 920 (e.g., in accordance with an alignment tolerance between the seventh set of operations and the ninth set of operations). In some examples, a cavity 1110 may be considered as an extension of a cavity 920, or a cavity 920 and a cavity 1110 may be collectively referred to as a single cavity. The ninth set of operations may also include forming cavities 1115 (e.g., fourth cavities) through the stack of layers 1105, where forming the cavities 1115 may also expose a portion of the material 1005 (e.g., of cavities 925). Like the cavities 925, the cavities 1115 may be formed in a pattern at locations corresponding to the cavities 335 and, in some examples, a cavity 1115 may be aligned with a respective cavity 925 (e.g., in accordance with an alignment tolerance between the seventh set of operations and the ninth set of operations). In some examples, a cavity 1115 may be considered as an extension of a cavity 925, or a cavity 925 and a cavity 1115 may be collectively considered to be a single cavity. Like the cavities 920 and cavities 925, in some examples, the cavities 1110 and the cavities 1115 may be formed concurrently (e.g., using one or more common etching operations), and may be formed with a degree of taper associated with an etching operation.

The ninth set of operations may also include operations (e.g., deposition operations) that support filling the cavities 1110 and the cavities 1115 (e.g., with a sacrificial material, to support subsequent operations). For example, the ninth set of operations may include depositing a material 1120 in the cavities 1110 and the cavities 1115, which may be the same as the material 1005 (e.g., sacrificial carbon, with or without a liner material, or a stack of different materials). In various examples, the ninth set of manufacturing operations may be excluded, or may be performed multiple times (e.g., to support more or fewer layers of the material 910 or the material 915, to support smaller openings or other size in an xy-plane of cavities).

The ninth set of operations may also include operations (e.g., oxide deposition operations) that support adding a layer of material over the stack of layers 1105. For example, the ninth set of operations may include depositing a layer of a material 1125 over the stack of layers 1105, where the material 1125 may be a sacrificial barrier layer (e.g., an oxide layer, an oxide of silicon). In some examples, the material 1125 may be the same as the material 910 (e.g., a dielectric material, an oxide of silicon), and may shield openings of the cavities 1110 while operations are performed via openings of the cavities 1115.

FIG. 12 illustrates the material arrangement 300 (e.g., as a material arrangement 300-*j*) after a tenth set of one or more manufacturing operations. The tenth set of operations may include operations (e.g., photolithography operations) that clear cavities for forming various memory structures (e.g., associated with a string 220). For example, the tenth set of operations may include removing a portion of the layer of material 1125 at locations corresponding to a block 210 (e.g., over cavities 335, cavities 925, and cavities 1115, over material 1005 and material 1120). Removing the material 1125 over such locations may expose a top surface of material 1120 (e.g., at openings of the cavities 1115), which may support subsequent material removal operations.

The tenth set of operations may also include material removal operations (e.g., etching operations, wet etching operations, exhuming operations) that support forming cavities 1205. For example, the tenth set of operations may include removing exposed portions (e.g., portions exposed based on removing portions of the material 1125, and other selective etching operations of the tenth set of operations) of the material 1120, the material 1005, the material 710, and the material 705. Thus, for each cavity 1205, such material removal operations may expose sidewalls of the material 910, the material 915, the material 810, the material 805, the material 325, the material 320, and the material 505 (e.g., an oxidized semiconductor etch stop). In some examples, each cavity 1205 may support the formation of a string of memory cells 205, among other features associated with a string 220.

Figure 13:
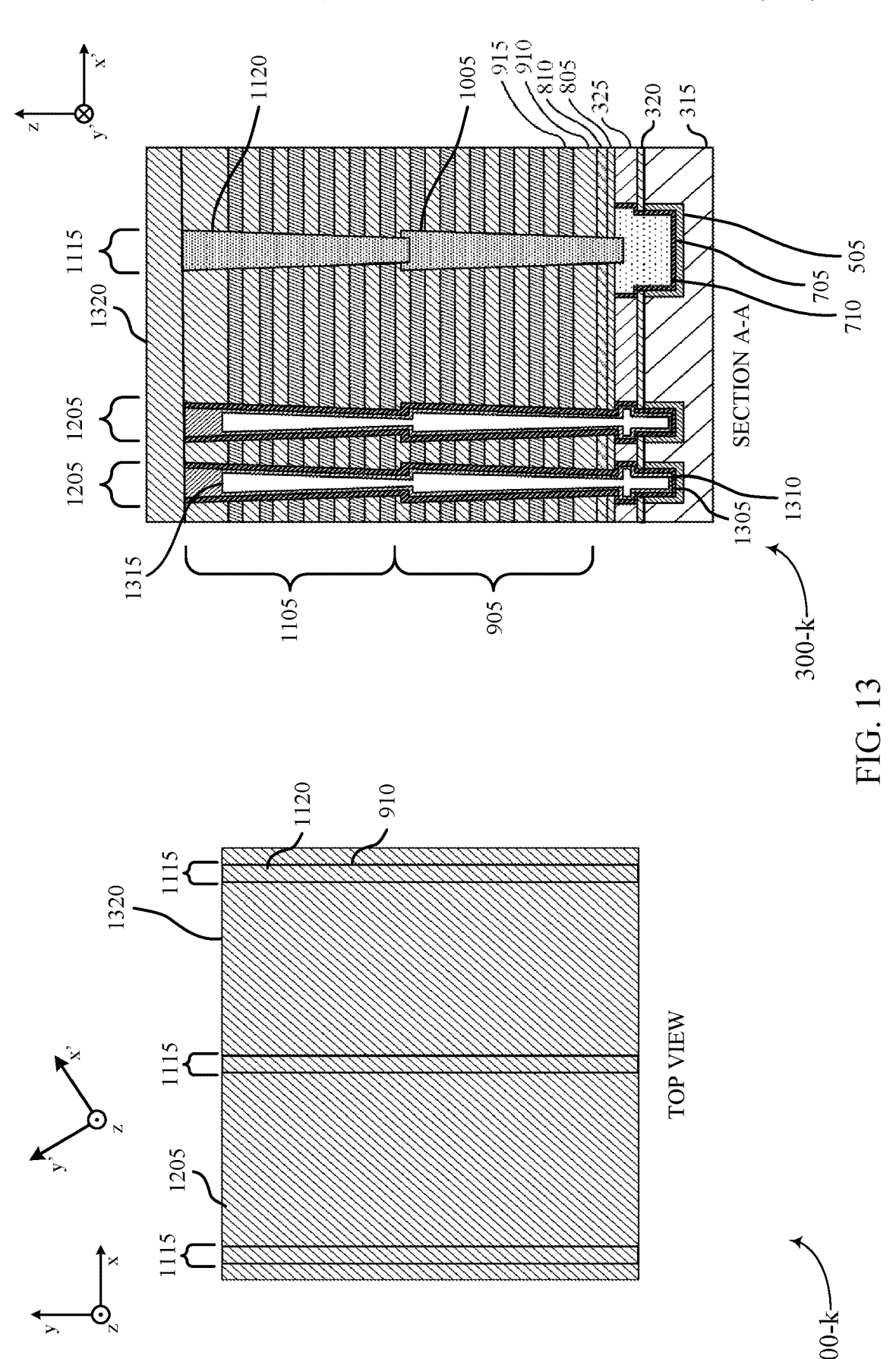

FIG. 13 illustrates the material arrangement 300 (e.g., as a material arrangement 300-*k*) after an eleventh set of one or more manufacturing operations. The eleventh set of operations may include operations (e.g., one or more deposition operations) that support forming a set of memory cells (e.g., memory cells 105, memory cells 205, memory cells of a string 220) in the cavities 1205. For example, the eleventh set of operations may include depositing a material 1305, a material 1310, and a material 1315 in the cavities 1205 to form structures of memory cells 105. The material 1305 may support a charge-trapping function of memory cells 105 and, in various examples, may include one or more layers of material. In some examples, the material 1305 may include a first layer (e.g., a dielectric layer, an oxide layer, an oxide of silicon) in contact with walls of each cavity 1205, which may support first dielectric materials 125 of a string of memory cells 105, a second layer (e.g., a charge-trapping layer, a nitride layer, a nitride of silicon) over the first layer, which may support charge trapping structures 120 of the string of memory cells 105, and a third layer (e.g., a dielectric layer, an oxide layer, an oxide of silicon) over the second layer, which may support second dielectric materials 125 of the string or memory cells 105. The material 1310 may be a semiconductor material (e.g., polysilicon, in contact with the material 1305 or third layer thereof), which may support channel portions of the string of memory cells 105 (e.g., between respective first nodes 130 and second nodes 135). The material 1315 may be a dielectric material (e.g., silicon oxide, in contact with the material 1310) and may fill the remainder of the cavities 1205.

In some examples, the eleventh set of manufacturing may also include operations (e.g., etching operations, one or more deposition operations) that further support forming a string of memory cells in the cavities 1205. For example, the eleventh set of operations may include a removing a portion of the material 1305, a portion of the material 1310, and a portion of the material 1315 (e.g., via recessing, via dry etching) from a top portion of the cavities 1205. In some examples, the material 1315 may be recessed into the cavities 1205, and the material 1310 may then be deposited in the cavities 1205 (e.g., to fill the top portions of the cavities 1205, a plug formation operation). In some examples, the eleventh set of operations may include operations (e.g., planarizing operations) to flatten a top surface of the material arrangement 300-$k$ (e.g., via CMP), which may include removing portions (e.g., top portions) of the material 1305, the material 1310, the material 1005, the material 910 (e.g., of a top layer of the stack of layers 1105), or a combination thereof. In some examples, the eleventh set of operations may include depositing a material 1320 over the cavities 1205 (e.g., the filled cavities 1205) and the stack of layers 1105 or the additional layers. In some cases, the material 1320 may be the same as the material 910 (e.g., an oxide material, an oxide of silicon).

Figure 14:
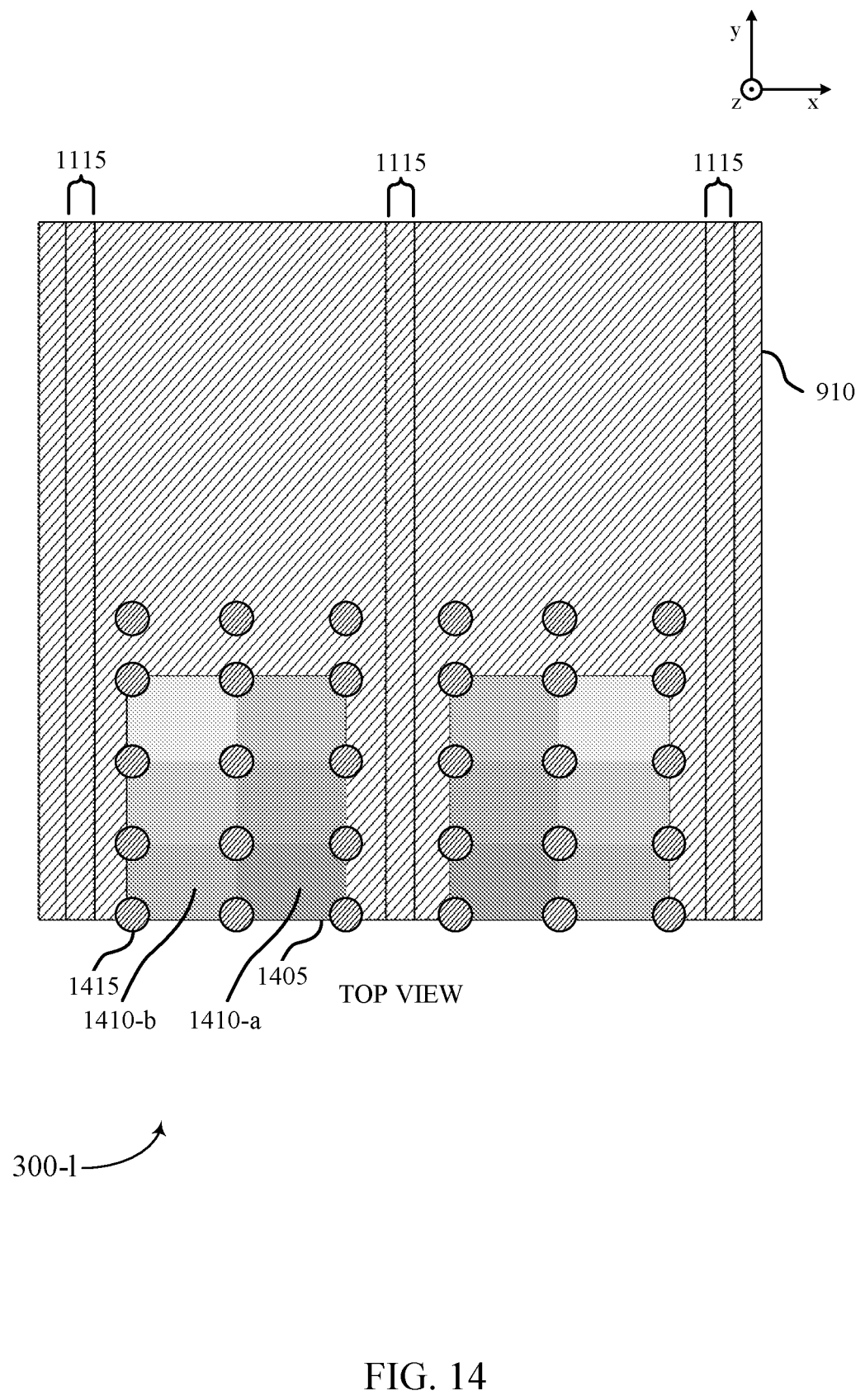

FIG. 14 illustrates the material arrangement 300 (e.g., as a material arrangement 300-1) after a twelfth set of one or more manufacturing operations. The twelfth set of operations may include operations (e.g., one or more deposition operations, etching operations) that support forming features of staircase structures 1405 and support pillars 1415 (e.g., structural piers). For example, the twelfth set of operations may include removing material (e.g., the material 910, the material 915) from the stack of layers 905 or the stack of layers 1105 (e.g., via etching, dry etching) to expose each level 1410 of the staircase structures 1405, where each of the levels 1410 may correspond to a different exposed layer of the material 915. A level 1410-$a$ and a level 1410-$b$ may be at a different height (e.g., with respect to the z-direction), where one or more additional layers of the stack of layers 905 or the stack of 1105 may be removed to expose different layers of the material 915 (e.g., corresponding to the levels 1410). Connections may be formed at the levels 1410 to couple with access lines (e.g., word lines 265) that connect to the memory cells (e.g., memory cells 105, memory cells 205). In some cases, the support pillars 1415 may be formed through the staircase structures 1405, where portions of material (e.g., material 910, material 915) are removed to form cavities and various materials (e.g., oxide material) are deposited in the cavities. The support pillars 1415 may provide structural support of the staircase structures 1405 (e.g., to support the staircase structure 1405, along the z-direction, when layers of the material 915 are removed from the stack of layers 905 or the stack of layers 1105 to support forming word lines 265).

Figure 15:
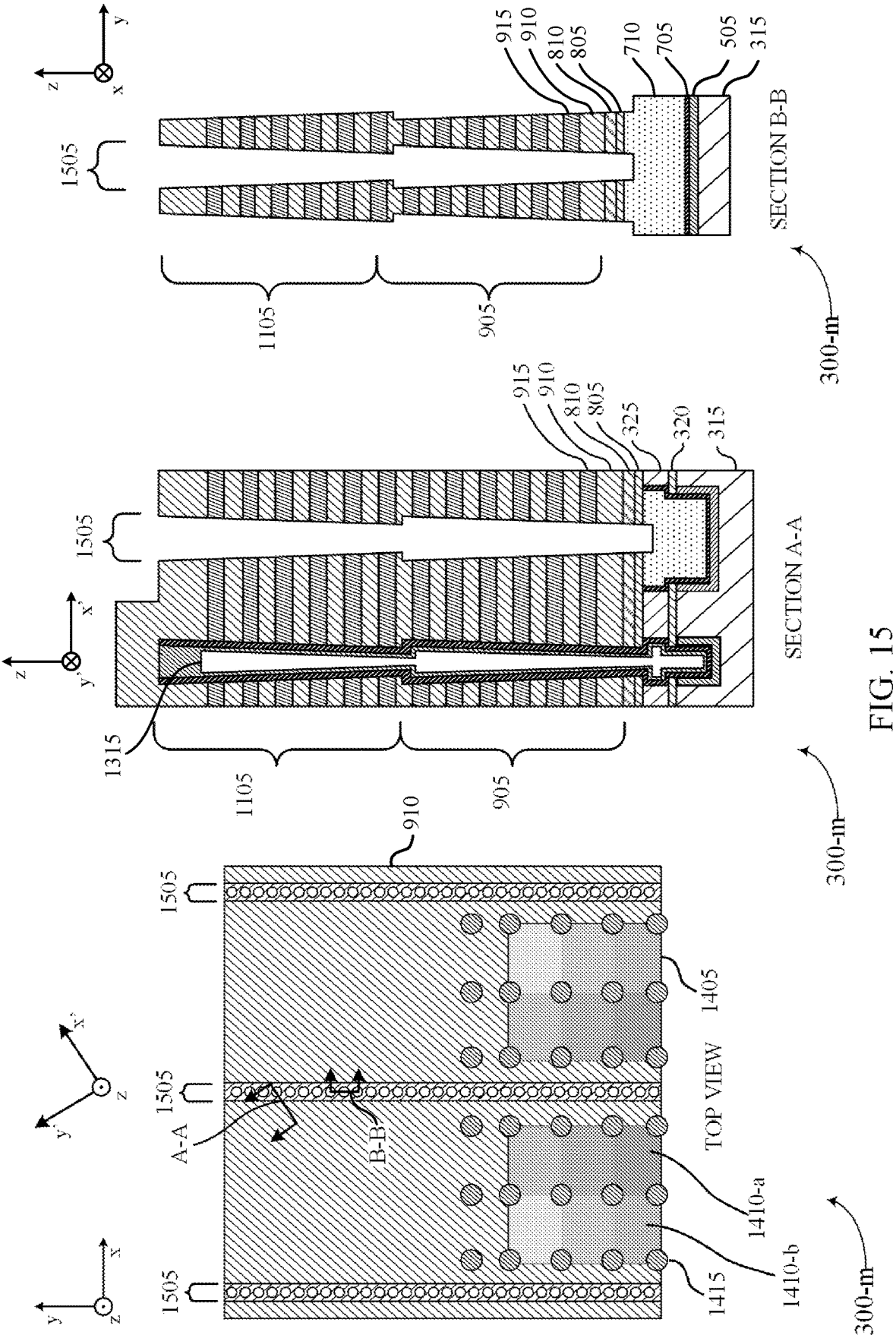

FIG. 15 illustrates the material arrangement 300 (e.g., as a material arrangement 300-$m$) after a thirteenth set of one or more manufacturing operations. The thirteenth set of operations may include operations (e.g., photolithography operations) that support forming various memory structures (e.g., associated with word lines 265). For example, the thirteenth set of operations may include removing a portion of the layer of material 1320 at locations between blocks 210 (e.g., over trenches 340, cavities 920, and cavities 1110, over material 1005 and material 1120). Removing the material

1320 over such locations may expose a top surface of the material 1120 (e.g., exposing openings of the cavities 1110), which may support subsequent removal operations.

The thirteenth set of operations may also include material removal operations (e.g., etching operations, wet etching operations, exhuming operations) that support forming cavities 1505. For example, the thirteenth set of operations may include removing exposed portions (e.g., portions exposed based on removing portions of the material 1320, and other selective etching operations of the thirteenth set of operations) of the material 1120, the material 1005, the material 710, and the material 705. Thus, for each cavity 1505, such material removal operations may expose sidewalls of the material 910, the material 915, the material 810, and the material 805 (e.g., using the material 710 as an etch stop). The cavities 1505 may be aligned (e.g., in rows) along the y-direction, and may support the formation of trenches.

Figure 16:
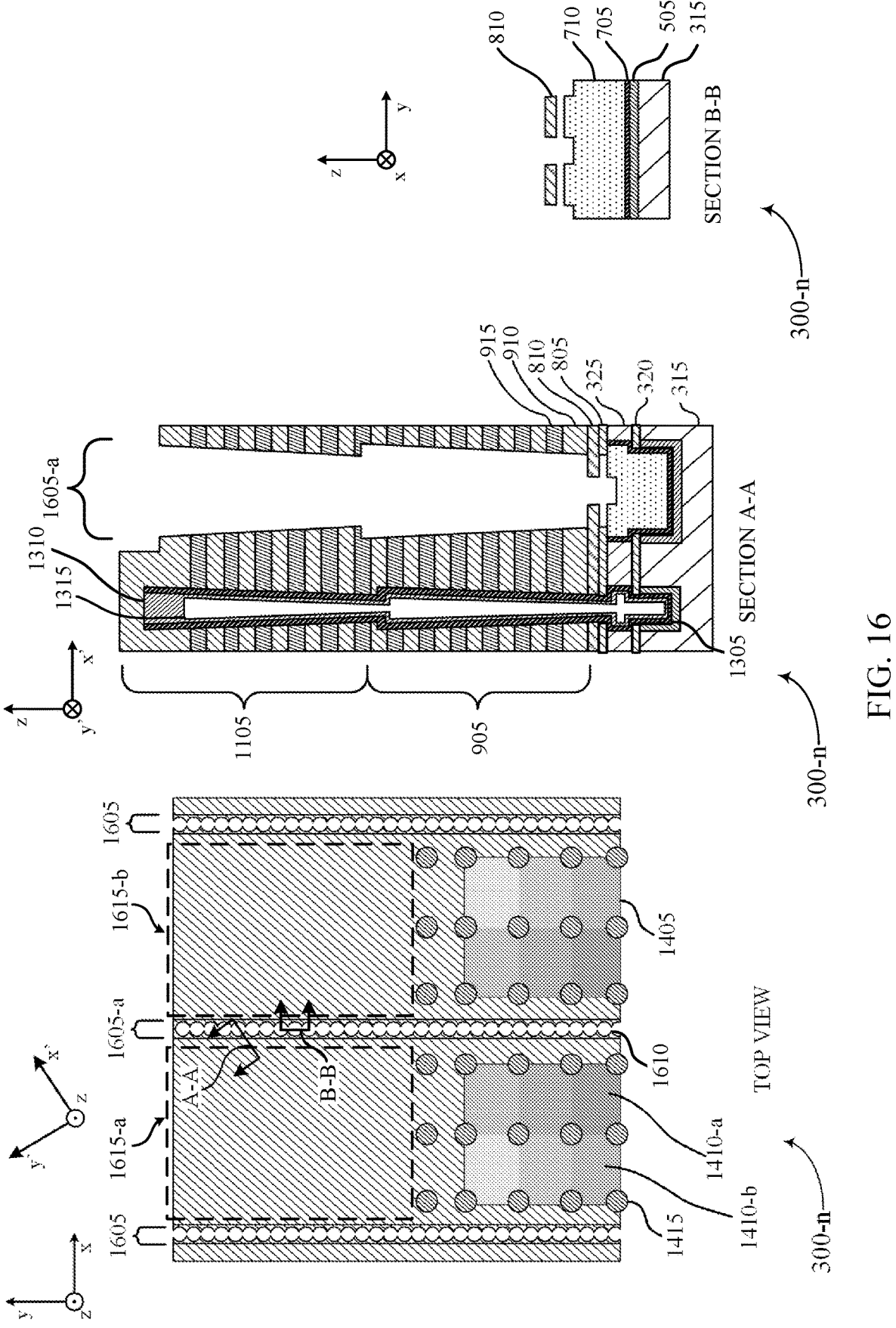

FIG. 16 illustrates the material arrangement 300 (e.g., as a material arrangement 300-$n$) after a fourteenth set of one or more manufacturing operations. The fourteenth set of operations may include operations (e.g., etching operations, wet etching operations, recessing operations) that support forming trenches 1605. For example, the fourteenth set of operations may include removing material from exposed portions of material 910 and 915 from the stack of layers 905 and the stack of layers 1105 and exposed portions of the material 805 (e.g., in the cavities 1505) to merge the cavities 1505, forming trenches 1605 (e.g., slits, second trenches). In some examples, by forming the trenches 1605 from the cavities 1505, a degree of taper associated with the trenches 1605 may be less than a degree of taper associated with a trench formed in accordance with a single elongated opening. The material removal processes of the fourteenth set of operations may account for non-uniform discrepancies of the cavities 1505 (e.g., tilt, shape distortion) to form characteristics (e.g., tapers, aspect ratios) of the trenches 1605. The trenches 1605 may support various features of memory architecture 200 (e.g., providing access to form word lines 265 and transistors 240 from boundaries between blocks 210).

As a result of being formed from merged cavities, the walls of the trenches 1605 may have a varying wall separation (e.g., separation across the trenches 1605 along the x-direction) at different locations of the trenches 1605 (e.g., at locations along the y-direction). For example, remaining portions of the material 910 and the material 915 (e.g., a wall of the trench 1605) may include projections 1610 into the trench 1605. When a trench 1605 is filled with one or more dielectric materials, the one or more dielectric materials may accordingly have projections (e.g., between projections 1610) that are aligned towards array regions (e.g., along the x-direction). For example, the trench 1605-$a$ may be between (e.g., positioned between) an array region 1615-$a$ (e.g., a first array region) and an array region 1615-$b$ (e.g., a second array region), and a dielectric fill of the trench 1605-$a$ (e.g., a second dielectric material) may be in contact with at least layers of the material 910 of the array region 1615-$a$ (e.g., first layers of a first dielectric) and layers of the material 910 of the array region 1615-$b$ (e.g., second layers of the first dielectric). The layers of the material 910 of the array region 1615-$a$ may include projections 1610 toward the array region 1615-$b$ (e.g., along the x-direction) and the layers of the material 910 of the array region 1615-$b$ may include projections 1610 toward the array region 1615-$a$ (e.g., along the x-direction). As a result of the deposition as a stack of layers 905, as a stack of layers 1105, or both, the layers of the material 910 may be aligned (e.g., across the trench 1605) in a height dimension (e.g., along the z-direction). In various examples (e.g., depending on a pattern of cavities 920), the projections may be aligned across a trench 1605 (e.g., having the same or overlapping locations along the y-direction) or not aligned across the trench 1605 (e.g., staggered along the y-direction). In some examples, at least a portion of the trench 1605 may be filled with a same material as the material 910 (e.g., an oxide material, an oxide of silicon).

Figure 17:
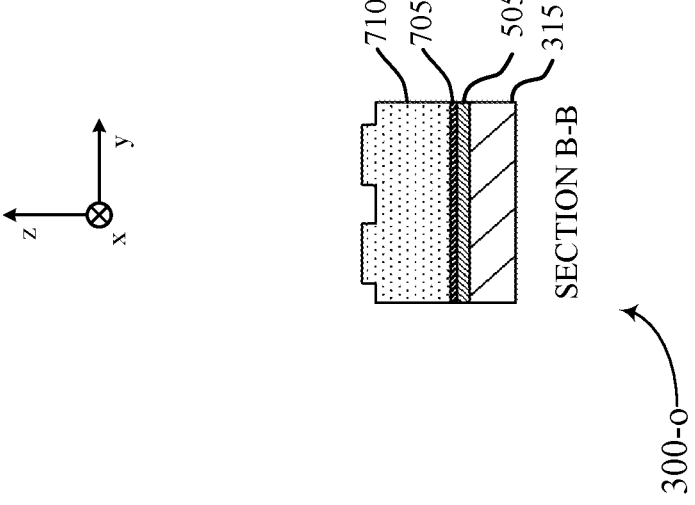
Figure 17:
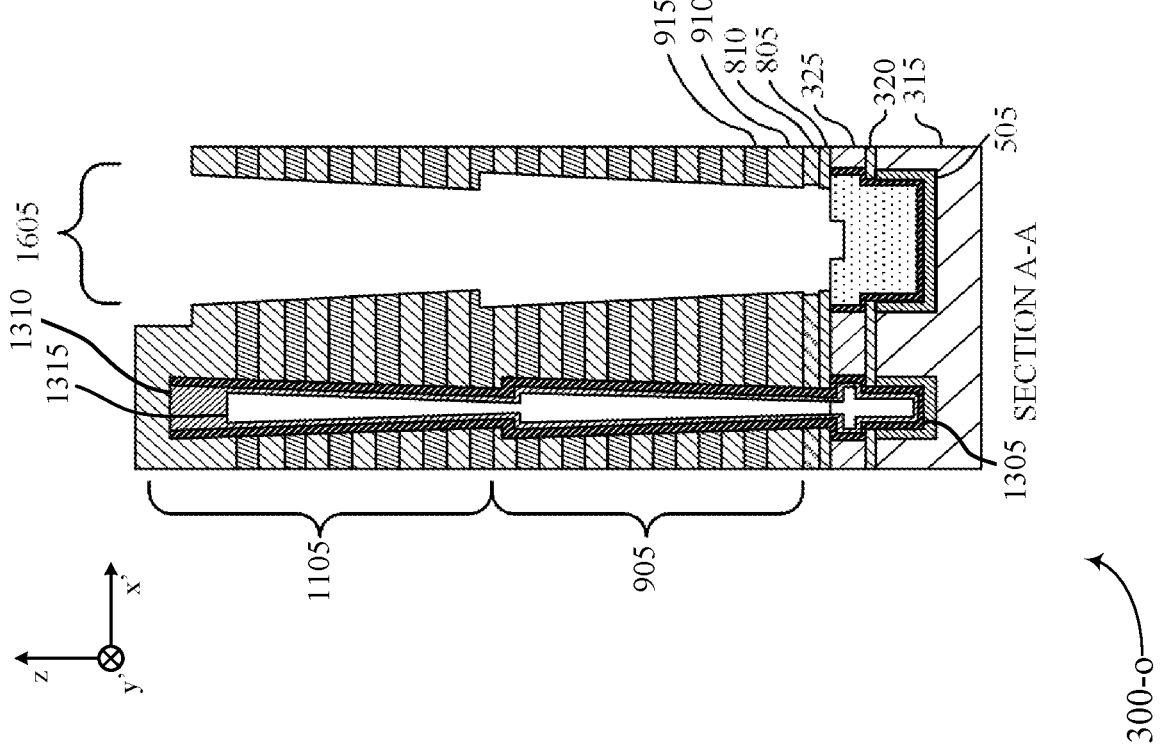

FIG. 17 illustrates the material arrangement 300 (e.g., as a material arrangement 300-o) after a fifteenth set of one or more manufacturing operations, as cross-sectional side views (e.g., relative to the cut plane A-A, relative to the cut plane B-B). The fifteenth set of operations may include operations (e.g., etching operations, dry etching operations) that support forming features in the trenches 1605. For example, the fifteenth set of manufacturing operations may including removing remaining portions of the material 810 (e.g., polysilicon) from the trenches 1605 to further clear the trenches 1605.

Figure 18:
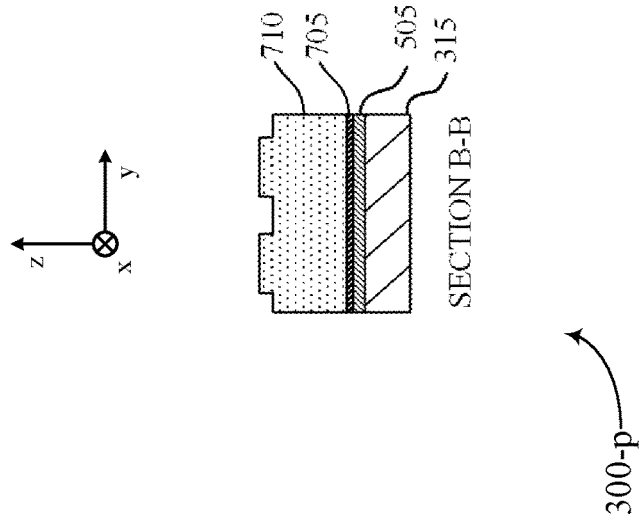
Figure 18:
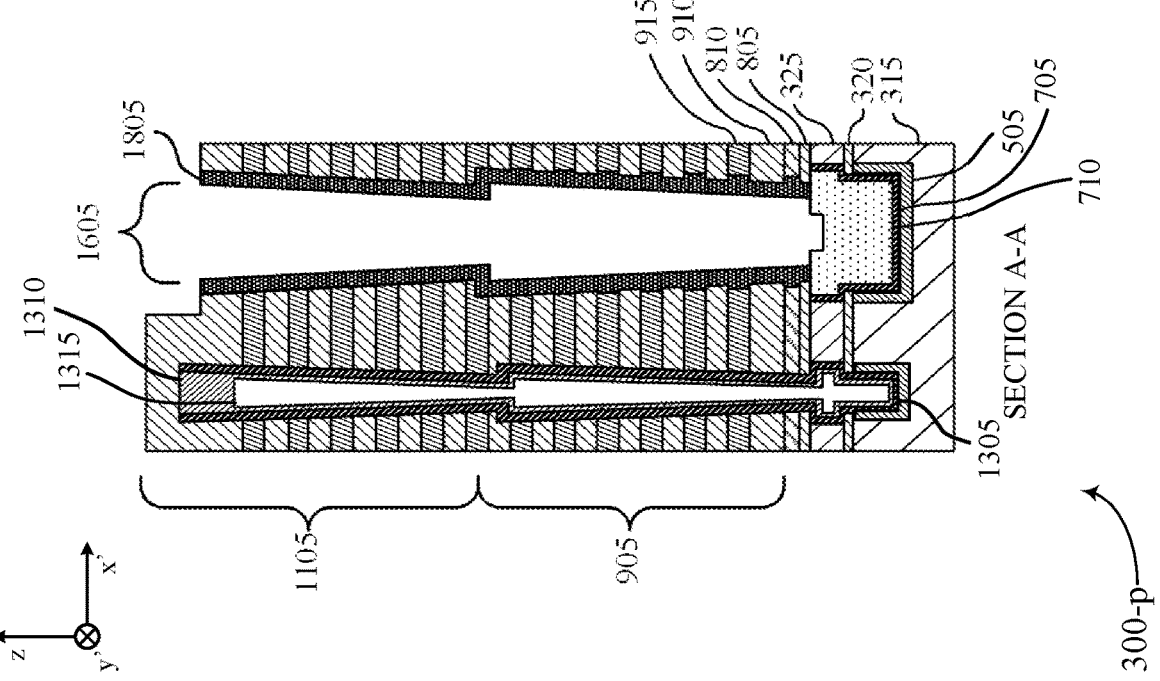

FIG. 18 illustrates the material arrangement 300 (e.g., as a material arrangement 300-p) after a sixteenth set of one or more manufacturing operations, as cross-sectional side views (e.g., relative to the cut plane A-A, relative to the cut plane B-B). The sixteenth set of operations may include operations (e.g., lateral contract liner deposition operations) that support forming features in the trenches 1605. For example, the sixteenth set of operations may include depositing a material 1805 (e.g., a liner material) on exposed surfaces (e.g., walls) of the trenches 1605. In various examples, the material 1805 may include one or more layers of material. For example, the material 1805 may include a first layer of a nitride (e.g., a nitride of silicon) in contact with exposed sidewalls (of the material 910 and the material 915) of the trenches 1605, a layer of an oxide (e.g., an oxide of silicon) in contact with the first layer, a second layer of nitride in contact with the layer of oxide, and a layer of polysilicon, among other examples. Depositing the material 1805 in the trenches 1605 may support the formation of various features associated with the memory architecture 200 in the trenches 1605. In some examples, the sixteenth set of operations may also include a material removal operation (e.g., etching operations, dry etching operations) that support forming features in the trenches 1605, where a portion of the material 1805 is removed from the trenches 1605 (e.g., from a bottom of the trenches 1605, opposite from openings of the trenches 1605).

Figure 19:
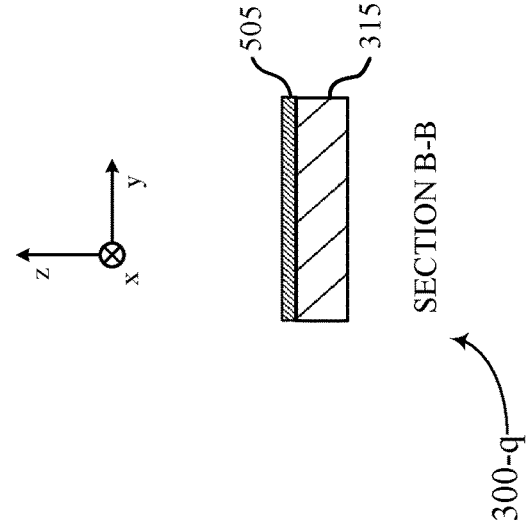
Figure 19:
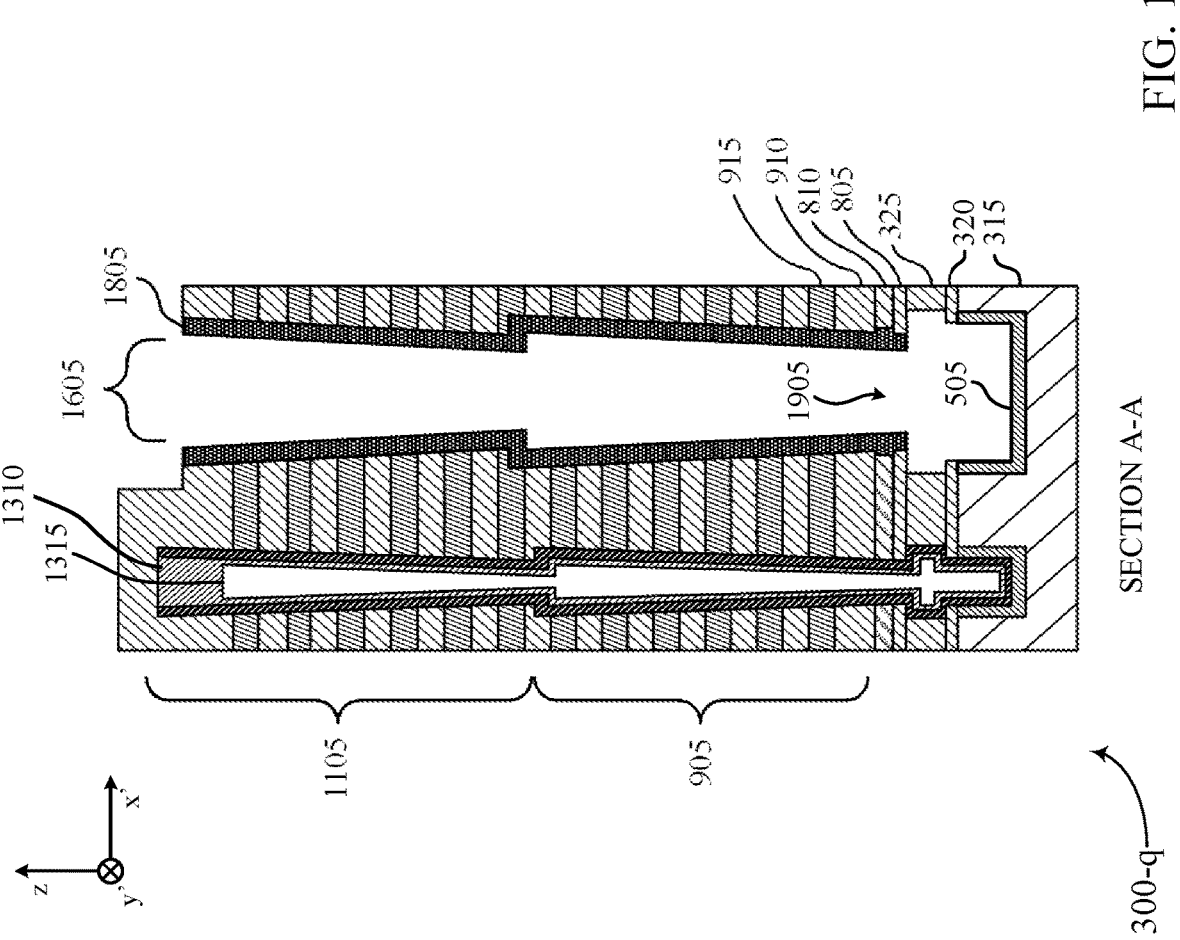

FIG. 19 illustrates the material arrangement 300 (e.g., as a material arrangement 300-q) after a seventeenth set of one or more manufacturing operations, as cross-sectional side views (e.g., relative to the cut plane A-A, relative to the cut plane B-B). The seventeenth set of operations may include operations (e.g., etching operations, wet etching operations, exhuming operations) that support forming voids 1905 (e.g., second voids). For example, the seventeenth set of operations may include removing the material 710 and the material 705 (e.g., first material portions) from the trenches 1605 (e.g., via openings of the trenches 1605). In some examples, removing the material 710 and the material 705 may expose surfaces of the material 325, the material 320, the material 505, and the material 805.

Figure 20:
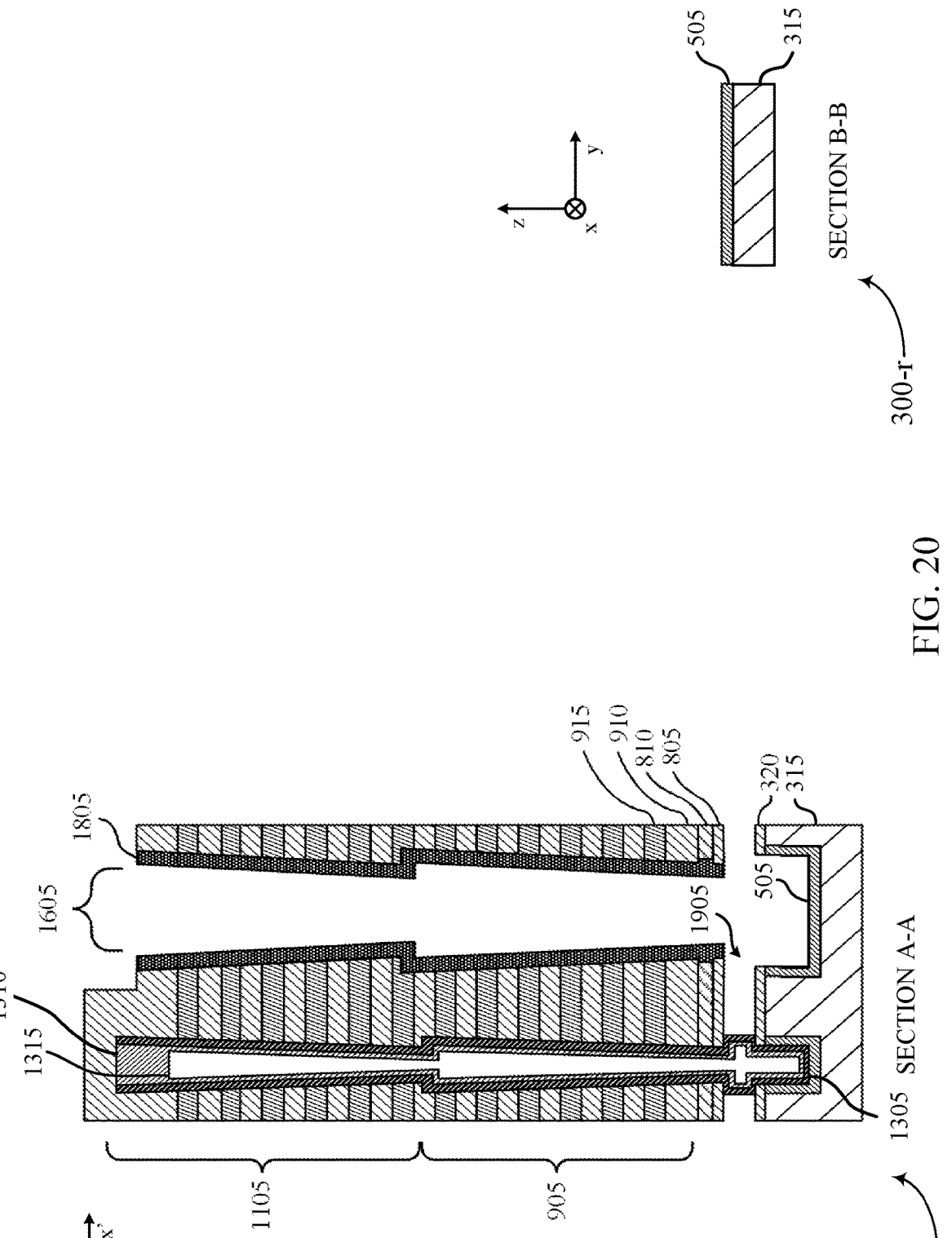

FIG. 20 illustrates the material arrangement 300 (e.g., as a material arrangement 300-r) after an eighteenth set of one or more manufacturing operations, as cross-sectional side views (e.g., relative to the cut plane A-A, relative to the cut plane B-B). The eighteenth set of operations may include operations (e.g., etching operations, wet etching operations, exhuming operations) that further support forming voids (e.g., second voids) in the trenches 1605. For example, the eighteenth set of operations may include extending the voids 1905 between a layer of the material 320 and a layer of the material 805 by removing the material 325 (e.g., via openings of the trenches 1605). Removing the material 325 may expose surfaces of the material 1305. After the eighteenth set of operations, portions of the stack of layers 905 and the stack of layers 1105, among other portions of the material layout, may be supported (e.g., along the z-direction, across the voids) by the materials deposited in the cavities 1205 (e.g., material 1305, material 1310, material 1315) and the pillars 1415.

Figure 21:
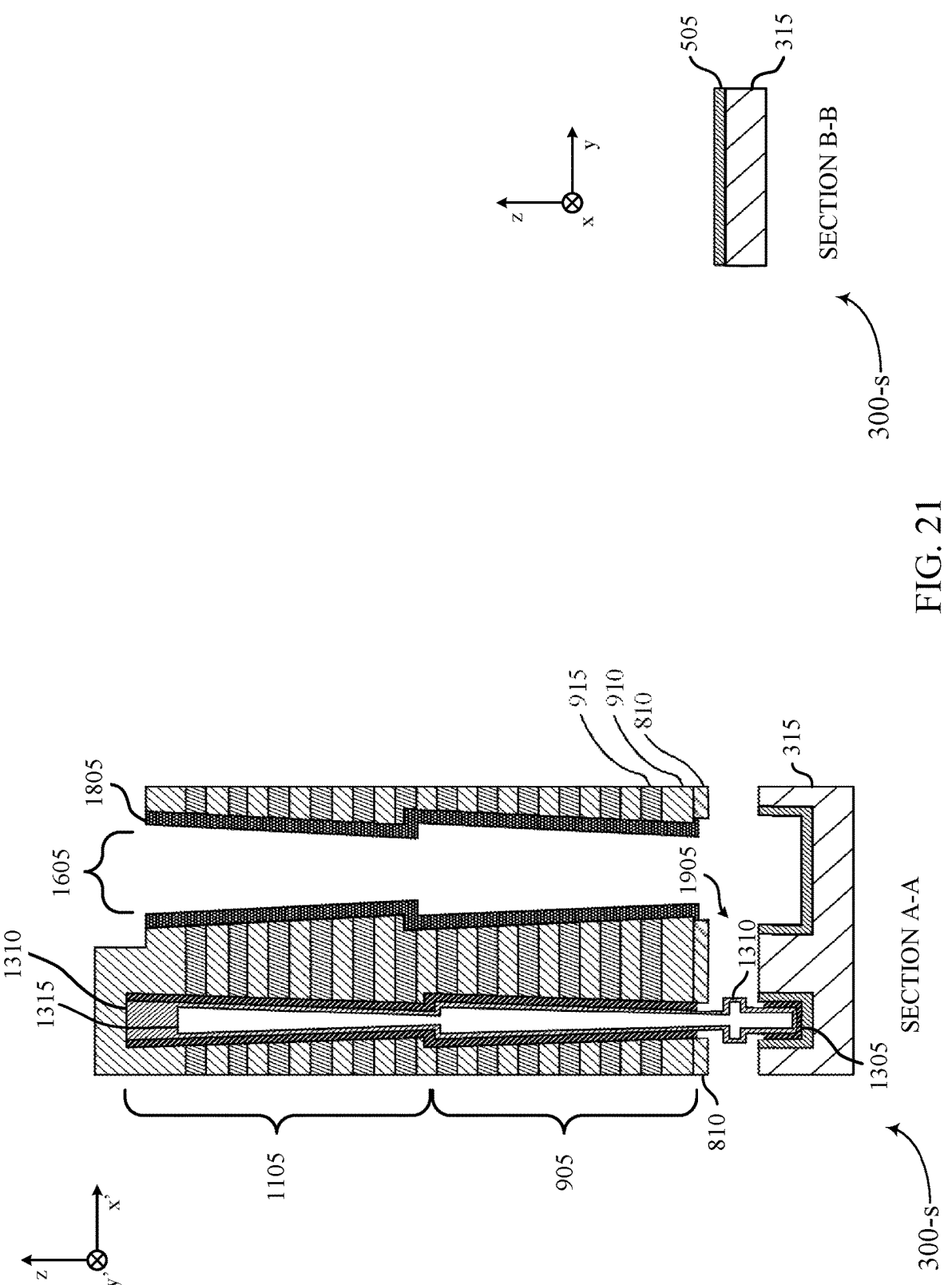

FIG. 21 illustrates the material arrangement 300 (e.g., as a material arrangement 300-s) after a nineteenth set of one or more manufacturing operations, as cross-sectional side views (e.g., relative to the cut plane A-A, relative to the cut plane B-B). The nineteenth set of operations may include operations (e.g., etching operations, wet etching operations, exhuming operations) that support forming features in the trenches 1605. For example, the nineteenth set of operations may include removing portions of the material 320, the material 805 (e.g., a lateral contact oxide removal), and the material 1305 (e.g., a lateral contact storage nitride removal) that are exposed via openings of the trenches 1605, which may extend the voids 1905 (e.g., along the x-direction and y-direction). Removing portions of the material 325, the material 1305, the material 320, and the material 805 may expose a surface of the material 1310 (e.g., a channel polysilicon to support forming transistor structures, such as transistors 240) in the voids.

FIG. 22 illustrates the material arrangement 300 (e.g., as a material arrangement 300-t) after a twentieth set of one or more manufacturing operations, as cross-sectional side views (e.g., relative to the cut plane A-A, relative to the cut plane B-B). The twentieth set of operations may include operations (e.g., a doped polysilicon deposition operation) that support forming various features of the memory architecture 200 (e.g., transistors 240). For example, the twentieth set of operations may include depositing a material 2205 via openings of the trenches 1605, which may include depositing the material 2205 in contact with the material 1310, the material 810, and the material 315 (e.g., to form a source contact for transistors 240, to form a channel between memory cells 205 of a string 220 and the layer of material 305, not shown). The material 2205 may include a semiconductor material (e.g., a doped polysilicon material, an n+ doped polysilicon material). The twentieth set of operations may include an etch-back operation to remove portions of the material 2205 from surfaces of the trenches 1605 (e.g., from sidewalls of the trenches 1605). In some examples, the twentieth set of operations may also include removing the material 1805 from the trenches 1605 (e.g., in a wet etching operation, a liner removal operation).

Figure 23:
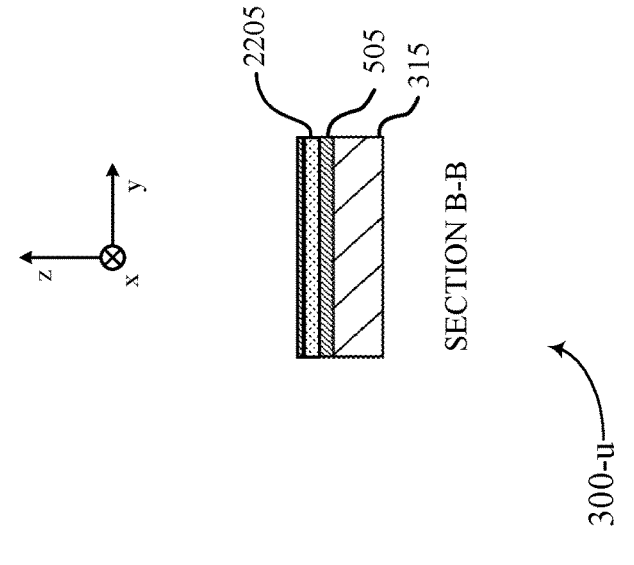
Figure 23:
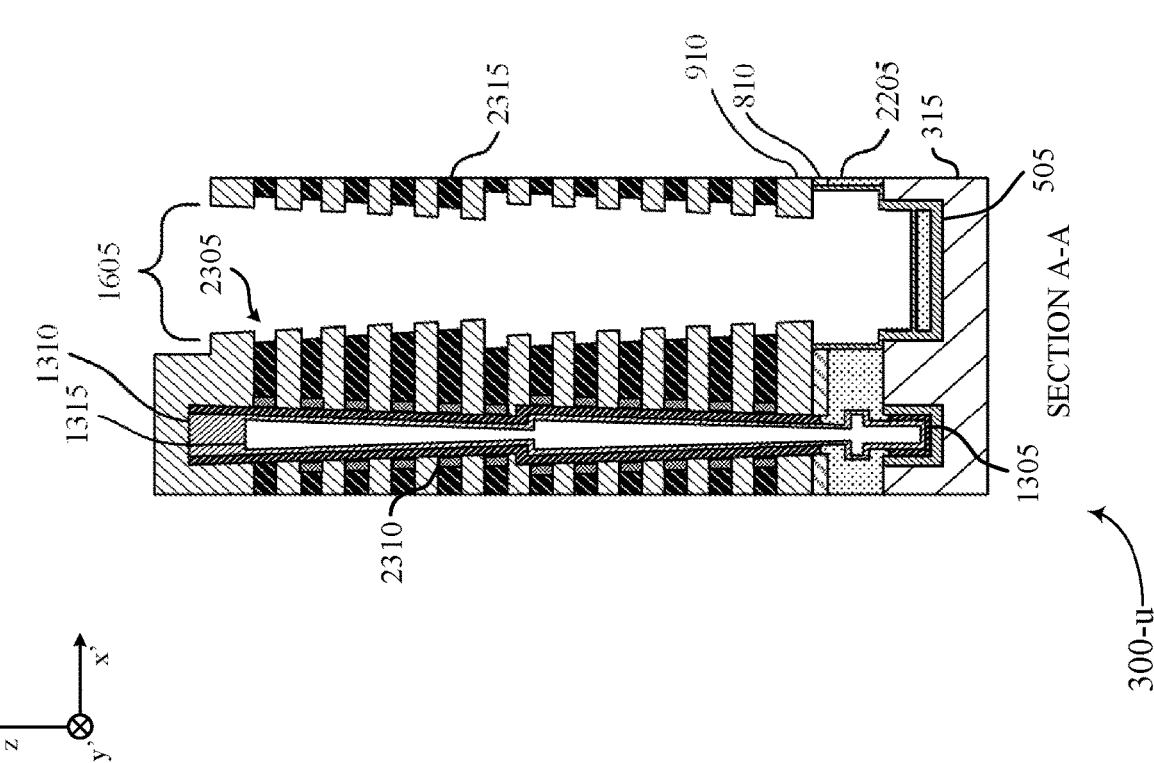

FIG. 23 illustrates the material arrangement 300 (e.g., as a material arrangement 300-u) after a twenty-first set of one or more manufacturing operations, as cross-sectional side views (e.g., relative to the cut plane A-A, relative to the cut plane B-B). The twenty-first set of operations may include operations (e.g., oxidization operations, etching operations, exhuming operations) that support forming voids 2305 (e.g., first voids). For example, the twenty-first set of operations may include oxidizing exposed surfaces of the material 810 and the material 2205 to form additional portions of the material 505 (e.g., an oxide, an oxide of silicon), which may act as an etch stop (e.g., a wet etch barrier). The twenty-first set of operations may also include forming voids 2305 by removing the material 915 from the stack of layers 905 and the stack of layers 1105. Forming such voids may expose portions of the material 1305 and the pillars 1415, which may remain in contact with the material 910 and support the material 910 across the voids 2305 (e.g., along the z-direction) for the formation of word lines (e.g., word lines 265), among various structures of the memory architecture 200.

The twenty-first set of operations may also include operations (e.g., one or more deposition operations, metal fill operations, etching operations) that support forming word lines (e.g., word lines 265) between layers of the material 910. In some examples, the twenty-first set of operations may include depositing a material 2310 in contact with the material 1305 (e.g., in the voids 2305), which may also be formed along surfaces of the material 910. The material 2310 may be a dielectric material (e.g., a high-K material) such as aluminum oxide, and may support a dielectric function of memory cells 205 (e.g., a dielectric material 125). The twenty-first set of operations may also include depositing a material 2315 in the voids between layers of material 910 (e.g., in the voids 2305, in contact with the material 2310, where applicable). The material 2315 may include one or more conductive materials, such as tungsten. The material 2315 may support forming word lines 265. In some cases, the material 2315 may be etched (e.g., in a recess etch operation) back in to the voids to provide electrical isolation between word lines 265. The trenches 1605 may subsequently be filled with a dielectric material, which may provide electrical isolation and mechanical structure between blocks 210.

Thus, in accordance with the examples of the first through twenty-first sets of operations, aspects of the memory architecture 200 may be formed through various material addition and subtraction operations, which include techniques for leveraging favorable positioning tolerances within concurrent operations. For example, concurrently-formed cavities (e.g., cavities 920 and 925, cavities 1110 and 1115) may leverage relatively favorable positioning tolerances for locating features associated with strings 220 (e.g., a string of memory cells 205) and isolation regions between blocks 210 (e.g., trenches 1605), while forming some of the cavities (e.g., cavities 920, cavities 1110) as an intermediate step to forming trenches (e.g., trenches 1605) may support such trenches being formed with relatively less taper than forming trenches directly (e.g., via an elongated trench opening). Further, forming various etch stop features concurrently (e.g., concurrently depositing materials 705 and 710) may further leverage relatively favorable positioning tolerances within certain operations (e.g., of the first through sixth sets of operations) to support formation of features of the material arrangement 300 in separate operations (e.g., forming aspects of strings 220 via cavities 925, cavities 1115, and 1205 during the seventh through eleventh sets of operations, and forming aspects of strings 220, word lines 265, and isolation between blocks 210 during the thirteenth through twenty-first sets of operations). The twenty-first set of operations may be followed by other operations to support aspects of the memory architecture 200, such as forming bit lines 250 coupled with the strings 220 (e.g., conductive lines over the material arrangement 300-*u*, which may be aligned along the x-direction and coupled with the plugs of material 1310), and forming vertical contacts (e.g., vertical conductors) coupled with each of the word lines 265 (e.g., contacts electrically coupled with layers of material 2315 in the staircase region), among other features.

Figure 24:
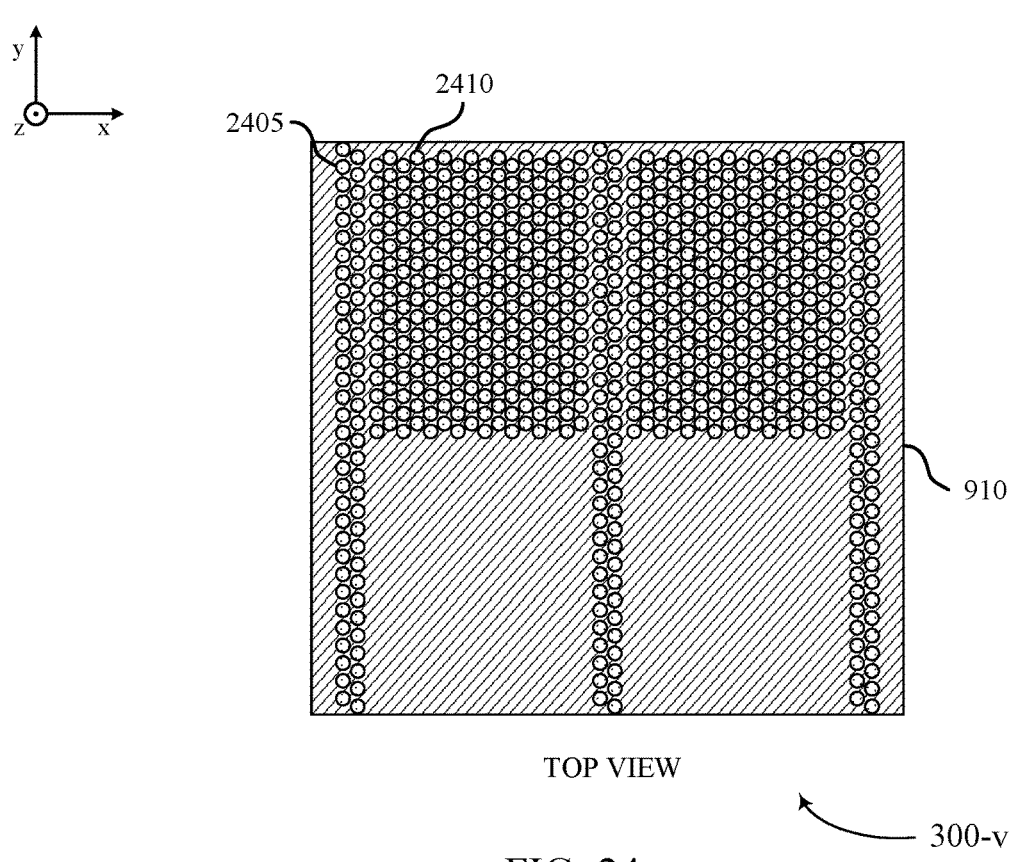
Figure 25:
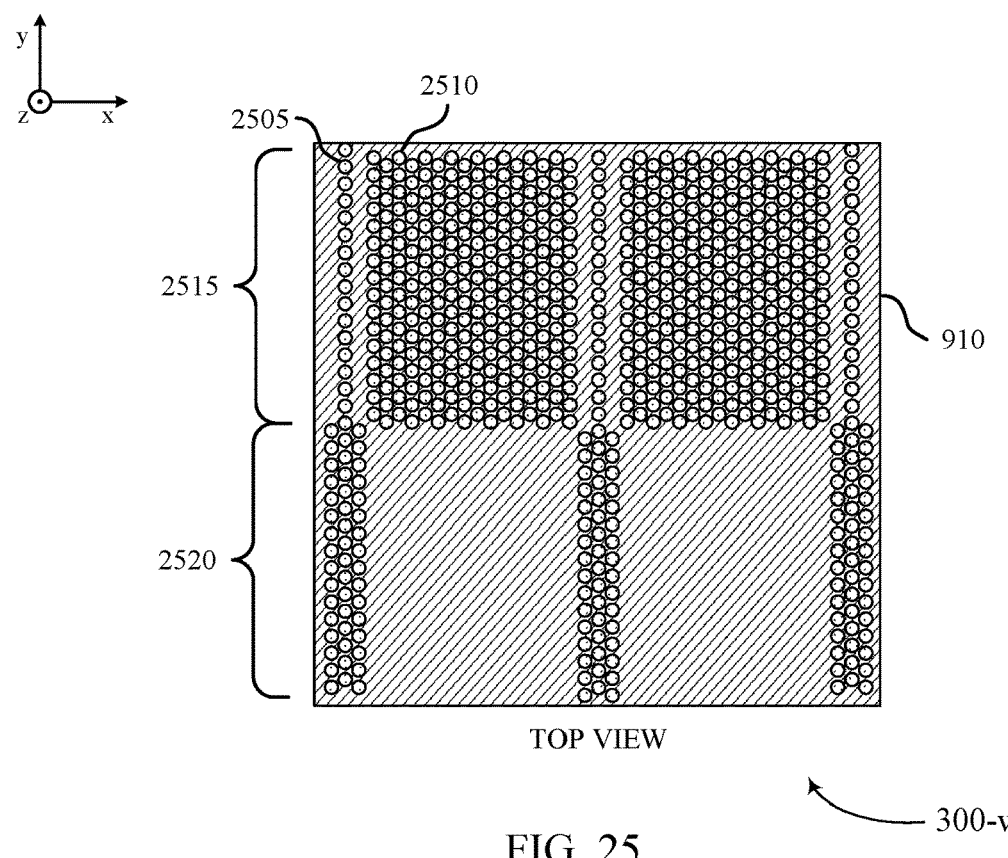
Figure 26:
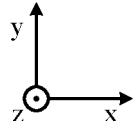
Figure 26:
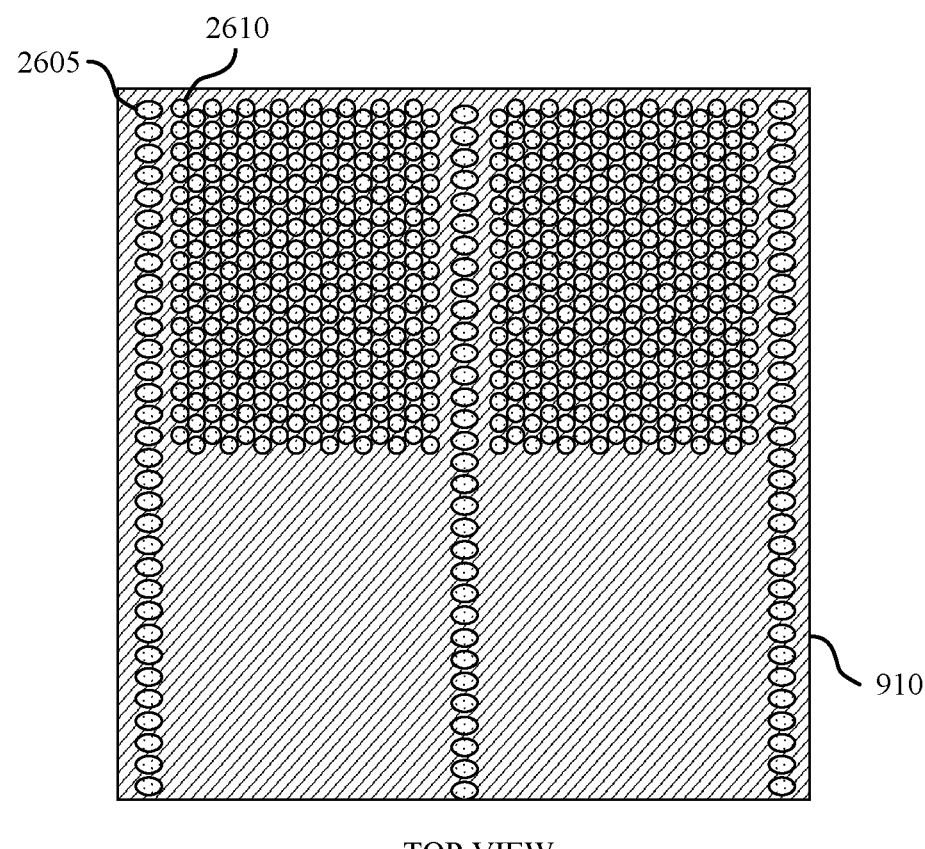
Figure 26:

FIGS. 24 through 26 illustrate portions of the material arrangement 300 after alternative sets of operations, which may be implemented to improve aspects of process margins (e.g., photolithography margins, etching margins) for the formation of the material arrangement 300. For example, aspects of such alternative sets of operations may supplement or replace the formation of cavities 920 and 925 of the seventh set of operations described with reference to FIG. 9, or the formation of cavities 1110 and 1115 described with reference to FIG. 11, or various combinations thereof.

FIG. 24 illustrates the material arrangement 300 (e.g., as a material arrangement 300-*v*) after a first set of one or more alternative manufacturing operations. In some examples, the first set of alternative operations may be a first alternative to aspects of the seventh set of operations, or the ninth set of operations, or both (e.g., for forming cavities through a stack of layers 905, for forming cavities through a stack of layers 1105). The example of FIG. 24 illustrates such techniques as a top view over a stack of layers that includes a layer of the material 910 as a top layer.

For example, after depositing a stack of layers (e.g., alternating layers of the material 910 and the material 915) over a substrate 301, the first set of alternative operations may include operations (e.g., etching operations, photolithography operations) for forming a different pattern of cavities through the stack of layers. For example, the first set of alternative operations may include forming cavities 2405 (e.g., third cavities) through the stack of layers which may, in some examples, expose a portion of the material 710 (e.g., using the material 710 as a cavity etch stop or trench etch stop). Like the cavities 920 and the cavities 1110, the cavities 2405 may be formed in a pattern at locations corresponding to the trenches 340.

Compared to the cavities 920, which may be arranged in a single row along the y-direction for each trench region, the cavities 2405 may be formed in a pattern of multiple rows along the y-direction for each trench region, which may support forming a wider trench (e.g., a wider trench 1605) while still leveraging the reduced taper associated with using a cavity etch process rather than a trench etch process (e.g., using a same opening size for cavities 2405 and cavities 2410). In subsequent operations, the cavities 2405 may be merged by removing material of the stack of layers along the x-direction and the y-direction to form an associated trench. In some examples, implementing multiple rows of the cavities 2405 to form wider trenches may improve process margins (e.g., etching margins, photolithography margins) in subsequent process steps, which may include a reduced recess etch to merge cavities 2410 compared with merging a single row of cavities 920. In some examples, such techniques may be accompanied by implementing cavities 2410 as a translational pattern across trenches along the x-direction, compared with the mirror symmetry across trenches of the cavities 925 as illustrated in FIG. 9.

The first set of alternative operations may also include forming cavities 2410 (e.g., fourth cavities) through the stack of layers, which may be the same as or similar to the techniques for forming cavities 925 or 1115 (e.g., for forming strings 220). For example, forming the cavities 2410 may also expose a portion of the material 710 (e.g., using the material 710 as a cavity etch stop). Like the cavities 925 and the cavities 1115, the cavities 2410 may be formed in a pattern at locations corresponding to the cavities 335. The cavities 2405 and the cavities 2410 may be formed concurrently (e.g., using one or more common etching operations), and may be formed with a degree of taper associated with an etching operation.

FIG. 25 illustrates the material arrangement 300 (e.g., as a material arrangement 300-*w*) after a second set of one or more alternative manufacturing operations. In some examples, the second set of alternative operations may be a second alternative to aspects of the seventh set of operations, or the ninth set of operations, or both (e.g., for forming cavities through a stack of layers 905, for forming cavities through a stack of layers 1105). The example of FIG. 25 illustrates such techniques as a top view over a stack of layers that includes a layer of the material 910 as a top layer.

For example, after depositing a stack of layers (e.g., alternating layers of the material 910 and the material 915) over a substrate 301, the second set of alternative operations may include operations (e.g., etching operations, photolithography operations) for forming a different pattern of cavities through the stack of layers. For example, the second set of alternative operations may include forming cavities 2505 (e.g., third cavities) through the stack of layers which may, in some examples, expose a portion of the material 710 (e.g., using the material 710 as a cavity etch stop or trench etch stop). Like the cavities 920 and the cavities 1110, the cavities 2505 may be formed in a pattern at locations corresponding to the trenches 340.

Compared to the cavities 920 and 2405, which may be arranged with one or more rows along the entire length of each trench region, the cavities 2505 may be formed with different quantities of rows in different portions of each trench. For example, a trench may be associated with a portion 2515 (e.g., between blocks 210) that has relatively fewer rows of cavities 2505 and a portion 2520 (e.g., between staircase regions) that has relatively more rows of cavities 2505. In subsequent operations, the cavities 2505 may be merged by removing material of the stack of layers to form an associated trench, which may have different widths (e.g., along the x-direction) in the different portions. In some examples, implementing portions of trenches with different quantities of rows of cavities 2505 may provide more uniform structural or process characteristics of the material arrangement 300-w, such as reducing variations related to etching operations (e.g., dry etch pattern density, local plasma behavior), which may be related to differences between regions having a relatively dense pattern of cavities (e.g., regions with cavities 2410) and regions with relatively less-dense patterns of cavities (e.g., a staircase region).

The second set of alternative operations may also include forming cavities 2510 (e.g., fourth cavities) through the stack of layers, which may be the same as or similar to the techniques for forming cavities 925 or 1115 (e.g., for forming strings 220). For example, forming the cavities 2510 may also expose a portion of the material 710 (e.g., using the material 710 as a cavity etch stop). Like the cavities 925 and the cavities 1115, the cavities 2510 may be formed in a pattern at locations corresponding to the cavities 335. The cavities 2505 and the cavities 2510 may be formed concurrently (e.g., using one or more common etching operations), and may be formed with a degree of taper associated with an etching operation.

FIG. 26 illustrates the material arrangement 300 (e.g., as a material arrangement 300-w) after a third set of one or more alternative manufacturing operations. In some examples, the third set of alternative operations may be a third alternative to aspects of the seventh set of operations, or the ninth set of operations, or both (e.g., for forming cavities through a stack of layers 905, for forming cavities through a stack of layers 1105). The example of FIG. 26 illustrates such techniques as a top view over a stack of layers that includes a layer of the material 910 as a top layer.

For example, after depositing a stack of layers (e.g., alternating layers of the material 910 and the material 915)

over a substrate 301, the third set of alternative operations may include operations (e.g., etching operations, photolithography operations) for forming cavities 2605 with non-circular openings. For example, the cavities 2605 may have elliptical openings with a minor axis aligned along the y-direction (e.g., along a direction of the respective trench). Forming the cavities 2605 may, in some examples, expose a portion of the material 710 (e.g., using the material 710 as a cavity etch stop or trench etch stop). Like the cavities 920 and the cavities 1110, the cavities 2605 may be formed in a pattern at locations corresponding to the trenches 340. Compared to cavities having circular openings, the elliptical cavities 2605 may further support improve process margins (e.g., etching margins, photolithography margins) in subsequent process steps. For example, ellipticity may reduce at deeper portions of the cavities 2605 (e.g., along the z-direction), which may support compensating for aspects of taper along the cavities 2605. In some examples, such techniques may reduce a degree of etching involved with merging cavities 2605 to form trenches (e.g., trenches 1605), which may reduce a pitch of blocks 210 (e.g., along the x-direction) to support increased array density.

The third set of alternative operations may also include forming cavities 2610 (e.g., fourth cavities) through the stack of layers, which may be the same as or similar to the techniques for forming cavities 925 or 1115 (e.g., for forming strings 220). For example, forming the cavities 2610 may also expose a portion of the material 710 (e.g., using the material 710 as a cavity etch stop). Like the cavities 925 and the cavities 1115, the cavities 2610 may be formed in a pattern at locations corresponding to the cavities 335. The cavities 2605 and the cavities 2610 may be formed concurrently (e.g., using one or more common etching operations), and may be formed with a degree of taper associated with an etching operation.

FIG. 27 shows a flowchart illustrating a method or methods 2700 that supports merged cavities and buried etch stops for three-dimensional memory arrays in accordance with examples as disclosed herein. The operations of method 2700 may be implemented by a manufacturing system or one or more controllers associated with a manufacturing system. In some examples, one or more controllers may execute a set of instructions to control one or more functional elements of the manufacturing system to perform the described functions. Additionally, or alternatively, one or more controllers may perform aspects of the described functions using special-purpose hardware.

At 2705, the method 2700 may include depositing a first stack of material layers over a substrate. The operations of 2705 may be performed in accordance with examples as disclosed herein.

At 2710, the method 2700 may include forming a plurality of first trenches through at least a portion of each material layer of the first stack of material layers. The operations of 2710 may be performed in accordance with examples as disclosed herein.

At 2715, the method 2700 may include forming a plurality of first cavities through at least a portion of each material layer of the first stack of material layers. The operations of 2715 may be performed in accordance with examples as disclosed herein.

At 2720, the method 2700 may include forming a first plurality of first material portions based at least in part on depositing one or more first materials in the plurality of first trenches. The operations of 2720 may be performed in accordance with examples as disclosed herein.

At 2725, the method 2700 may include forming a second plurality of first material portions based at least in part on depositing the one or more first materials in the plurality of first cavities. The operations of 2725 may be performed in accordance with examples as disclosed herein.

At 2730, the method 2700 may include depositing a second stack of material layers over the first stack of material layers, the second stack of material layers including alternating layers of a second material and a third material. The operations of 2730 may be performed in accordance with examples as disclosed herein.

At 2735, the method 2700 may include forming a plurality of second cavities through the second stack of material layers, where forming each second cavity of the plurality of second cavities exposes a portion of a first material portion of the first plurality of first material portions. The operations of 2735 may be performed in accordance with examples as disclosed herein.

At 2740, the method 2700 may include forming a plurality of third cavities through the second stack of material layers, where forming each third cavity of the plurality of third cavities exposes a portion of a first material portion of the second plurality of first material portions. The operations of 2740 may be performed in accordance with examples as disclosed herein.

At 2745, the method 2700 may include forming a plurality of second trenches based at least in part on removing portions of the second stack of material layers to merge second cavities of the plurality of second cavities. The operations of 2745 may be performed in accordance with examples as disclosed herein.

At 2750, the method 2700 may include forming a plurality of memory cells based at least in part on depositing a semiconductor material in the plurality of third cavities. The operations of 2750 may be performed in accordance with examples as disclosed herein.

In some examples, an apparatus (e.g., a manufacturing system) as described herein may perform a method or methods, such as the method 2700. The apparatus may include features, circuitry, logic, means, or instructions (e.g., a non-transitory computer-readable medium storing instructions executable by one or more controllers to control one or more functional elements of the manufacturing system), or any combination thereof for performing the following aspects of the present disclosure:

Aspect 1: A method or apparatus including operations, features, circuitry, logic, means, or instructions, or any combination thereof for: depositing a first stack of material layers over a substrate; forming a plurality of first trenches through at least a portion of each material layer of the first stack of material layers; forming a plurality of first cavities through at least a portion of each material layer of the first stack of material layers; forming a first plurality of first material portions based at least in part on depositing one or more first materials in the plurality of first trenches; forming a second plurality of first material portions based at least in part on depositing the one or more first materials in the plurality of first cavities; depositing a second stack of material layers over the first stack of material layers, the second stack of material layers including alternating layers of a second material and a third material; forming a plurality of second cavities through the second stack of material layers, where forming each second cavity of the plurality of second cavities exposes a portion of a first material portion of the first plurality of first material portions; forming a plurality of third cavities through the second stack of material layers, where forming each third cavity of the plurality of third cavities exposes a portion of a first material portion of the second plurality of first material portions; forming a plurality of second trenches based at least in part on removing portions of the second stack of material layers to merge second cavities of the plurality of second cavities; and forming a plurality of memory cells based at least in part on depositing a semiconductor material in the plurality of third cavities.

Aspect 2: The method or apparatus of aspect 1 where depositing the one or more first materials in the plurality of first trenches and depositing the one or more first materials in the plurality of first cavities are performed concurrently.

Aspect 3: The method or apparatus of any of aspects 1 through 2 where forming the plurality of second cavities and forming the plurality of third cavities are performed concurrently.

Aspect 4: The method or apparatus of any of aspects 1 through 3 where each second trench of the plurality of second trenches is associated with multiple rows of second cavities along the second trench.

Aspect 5: The method or apparatus of any of aspects 1 through 4 where each second trench of the plurality of second trenches is associated with a first quantity of rows of second cavities along a first portion of the second trench and a second quantity of rows of second cavities along a second portion of the second trench.

Aspect 6: The method or apparatus of any of aspects 1 through 5 where each second cavity of the plurality of second cavities is formed with an elliptical opening having a minor axis aligned along a direction of an associated second trench of the plurality of second trenches.

Aspect 7: The method or apparatus of any of aspects 1 through 6, further including operations, features, circuitry, logic, means, or instructions, or any combination thereof for forming a plurality of first voids based at least in part on removing the third material from the second stack of material layers and forming a plurality of word lines coupled with the plurality of memory cells based at least in part on depositing one or more first conductive materials in the plurality of first voids.

Aspect 8: The method or apparatus of any of aspects 1 through 7, further including operations, features, circuitry, logic, means, or instructions, or any combination thereof for forming a plurality of second voids based at least in part on removing the second plurality of first material portions and forming a plurality of transistors based at least in part on depositing a semiconductor and a gate dielectric in the plurality of second voids.

Aspect 9: The method or apparatus of any of aspects 1 through 8 where forming the first plurality of first material portions and the second plurality of first material portions includes operations, features, circuitry, logic, means, or instructions, or any combination thereof for depositing one or more metallic materials in the plurality of first trenches and in the plurality of first cavities.

Aspect 10: The method or apparatus of any of aspects 1 through 9 further including operations, features, circuitry, logic, means, or instructions, or any combination thereof for depositing a layer of a conductive material over the substrate, where the first stack of material layers is deposited over the layer of the conductive material.

It should be noted that the methods described above describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 11: An apparatus formed by a process including: depositing a first stack of material layers over a substrate; forming a plurality of first trenches through at least a portion of each material layer of the first stack of material layers; forming a plurality of first cavities through at least a portion of each material layer of the first stack of material layers; forming a first plurality of first material portions based at least in part on depositing one or more first materials in the plurality of first trenches; forming a second plurality of first material portions based at least in part on depositing the one or more first materials in the plurality of first cavities; depositing a second stack of material layers over the first stack of material layers, the second stack of material layers including alternating layers of a second material and a third material; forming a plurality of second cavities through the second stack of material layers, where forming each second cavity of the plurality of second cavities exposes a portion of a first material portion of the first plurality of first material portions; forming a plurality of third cavities through the second stack of material layers, where forming each third cavity of the plurality of third cavities exposes a portion of a first material portion of the second plurality of first material portions; forming a plurality of second trenches based at least in part on removing portions of the second stack of material layers to merge second cavities of the plurality of second cavities; and forming a plurality of memory cells based at least in part on depositing a semiconductor material in the plurality of third cavities.

Aspect 12: The apparatus of aspect 11, formed by the process including: forming the plurality of second cavities concurrently with forming the plurality of third cavities.

Aspect 13: The apparatus of any of aspects 11 through 12, where each second trench of the plurality of second trenches is associated with multiple rows of second cavities along the second trench.

Aspect 14: The apparatus of any of aspects 11 through 13, where each second trench of the plurality of second trenches is associated with a first quantity of rows of second cavities along a first portion of the second trench and a second quantity of rows of second cavities along a second portion of the second trench.

Aspect 15: The apparatus of any of aspects 11 through 14, where each second cavity of the plurality of second cavities is formed with an elliptical opening having a minor axis aligned along a direction of an associated second trench of the plurality of second trenches.

Aspect 16: The apparatus of any of aspects 11 through 15, formed by the process further including: forming a plurality of first voids based at least in part on removing the third material from the second stack of material layers; and forming a plurality of word lines coupled with the plurality of memory cells based at least in part on depositing one or more first conductive materials in the plurality of first voids.

Aspect 17: The apparatus of any of aspects 11 through 16, formed by the process further including: forming a plurality of second voids based at least in part on removing the second plurality of first material portions; and forming a plurality of transistors based at least in part on depositing a semiconductor and a gate dielectric in the plurality of second voids.

An apparatus is described. The following provides an overview of aspects of the apparatus as described herein:

Aspect 18: An apparatus, including: a first array region including a first plurality of memory cells and a first plurality of access lines coupled with the first plurality of memory cells, the first plurality of access lines arranged between first layers of a first dielectric material over a substrate; a second array region including a second plurality of memory cells and a second plurality of access lines coupled with the second plurality of memory cells, the second plurality of access lines arranged between second layers of the first dielectric material over the substrate; and a second dielectric material in contact with the first layers of the first dielectric material and in contact with the second layers of the first dielectric material, where: the first layers of the first dielectric material include first projections, in contact with the second dielectric material, toward the second array region; and the second layers of the first dielectric material include second projections, in contact with the second dielectric material, toward the first array region that are offset from the first projections along a length of the second dielectric material.

Aspect 19: The apparatus of aspect 18, where each first layer of the first dielectric material is aligned, in a height dimension relative to the substrate, with a respective second layer of the first dielectric material.

Aspect 20: The apparatus of any of aspects 18 through 19, where the second dielectric material is the same as the first dielectric material.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, and/or materials. In some examples, one layer or level may be composed of two or more sublayers or sublevels.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
depositing a first stack of material layers over a substrate;
forming a plurality of first trenches through at least a portion of each material layer of the first stack of material layers;
forming a plurality of first cavities through at least a portion of each material layer of the first stack of material layers;
forming a first plurality of first material portions based at least in part on depositing one or more first materials in the plurality of first trenches;
forming a second plurality of first material portions based at least in part on depositing the one or more first materials in the plurality of first cavities;
depositing a second stack of material layers over the first stack of material layers, the second stack of material layers comprising alternating layers of a second material and a third material;
forming a plurality of second cavities through the second stack of material layers, wherein forming each second cavity of the plurality of second cavities exposes a portion of a first material portion of the first plurality of first material portions;
forming a plurality of third cavities through the second stack of material layers, wherein forming each third cavity of the plurality of third cavities exposes a portion of a first material portion of the second plurality of first material portions;
forming a plurality of second trenches based at least in part on removing portions of the second stack of material layers to merge second cavities of the plurality of second cavities; and
forming a plurality of memory cells based at least in part on depositing a semiconductor material in the plurality of third cavities.

2. The method of claim 1, wherein depositing the one or more first materials in the plurality of first trenches and depositing the one or more first materials in the plurality of first cavities are performed concurrently.

3. The method of claim 1, wherein forming the plurality of second cavities and forming the plurality of third cavities are performed concurrently.

4. The method of claim 1, wherein each second trench of the plurality of second trenches is associated with multiple rows of second cavities along the second trench.

5. The method of claim 1, wherein each second trench of the plurality of second trenches is associated with a first quantity of rows of second cavities along a first portion of the second trench and a second quantity of rows of second cavities along a second portion of the second trench.

6. The method of claim 1, wherein each second cavity of the plurality of second cavities is formed with an elliptical opening having a minor axis aligned along a direction of an associated second trench of the plurality of second trenches.

7. The method of claim 1, further comprising:
forming a plurality of first voids based at least in part on removing the third material from the second stack of material layers; and
forming a plurality of word lines coupled with the plurality of memory cells based at least in part on depositing one or more first conductive materials in the plurality of first voids.

8. The method of claim 1, further comprising:
forming a plurality of second voids based at least in part on removing the second plurality of first material portions; and
forming a plurality of transistors based at least in part on depositing a semiconductor and a gate dielectric in the plurality of second voids.

9. The method of claim 1, wherein forming the first plurality of first material portions and the second plurality of first material portions comprises:
depositing one or more metallic materials in the plurality of first trenches and in the plurality of first cavities.

10. The method of claim 1, further comprising:
depositing a layer of a conductive material over the substrate, wherein the first stack of material layers is deposited over the layer of the conductive material.

11. An apparatus formed by a process comprising:
depositing a first stack of material layers over a substrate;
forming a plurality of first trenches through at least a portion of each material layer of the first stack of material layers;
forming a plurality of first cavities through at least a portion of each material layer of the first stack of material layers;
forming a first plurality of first material portions based at least in part on depositing one or more first materials in the plurality of first trenches;
forming a second plurality of first material portions based at least in part on depositing the one or more first materials in the plurality of first cavities;
depositing a second stack of material layers over the first stack of material layers, the second stack of material layers comprising alternating layers of a second material and a third material;
forming a plurality of second cavities through the second stack of material layers, wherein forming each second cavity of the plurality of second cavities exposes a portion of a first material portion of the first plurality of first material portions;

forming a plurality of third cavities through the second stack of material layers, wherein forming each third cavity of the plurality of third cavities exposes a portion of a first material portion of the second plurality of first material portions;

forming a plurality of second trenches based at least in part on removing portions of the second stack of material layers to merge second cavities of the plurality of second cavities; and forming a plurality of memory cells based at least in part on depositing a semiconductor material in the plurality of third cavities.

12. The apparatus of claim 11, formed by the process comprising:

forming the plurality of second cavities concurrently with forming the plurality of third cavities.

13. The apparatus of claim 11, wherein each second trench of the plurality of second trenches is associated with multiple rows of second cavities along the second trench.

14. The apparatus of claim 11, wherein each second trench of the plurality of second trenches is associated with a first quantity of rows of second cavities along a first portion of the second trench and a second quantity of rows of second cavities along a second portion of the second trench.

15. The apparatus of claim 11, wherein each second cavity of the plurality of second cavities is formed with an elliptical opening having a minor axis aligned along a direction of an associated second trench of the plurality of second trenches.

16. The apparatus of claim 11, formed by the process further comprising:

forming a plurality of first voids based at least in part on removing the third material from the second stack of material layers; and forming a plurality of word lines coupled with the plurality of memory cells based at least in part on depositing one or more first conductive materials in the plurality of first voids.

17. The apparatus of claim 11, formed by the process further comprising:

forming a plurality of second voids based at least in part on removing the second plurality of first material portions; and forming a plurality of transistors based at least in part on depositing a semiconductor and a gate dielectric in the plurality of second voids.

18. An apparatus, comprising:

a first array region comprising a first plurality of memory cells and a first plurality of access lines coupled with the first plurality of memory cells, the first plurality of access lines arranged between first layers of a first dielectric material over a substrate;

a second array region comprising a second plurality of memory cells and a second plurality of access lines coupled with the second plurality of memory cells, the second plurality of access lines arranged between second layers of the first dielectric material over the substrate; and a second dielectric material in contact with the first layers of the first dielectric material and in contact with the second layers of the first dielectric material, wherein:

the first layers of the first dielectric material comprise first projections, in contact with the second dielectric material, toward the second array region;

the second layers of the first dielectric material comprise second projections, in contact with the second dielectric material, toward the first array region that are offset from the first projections along a length of the second dielectric material; and the second dielectric material extends between the first projections towards the first array region and extends between the second projections towards the second array region.

19. The apparatus of claim 18, wherein each first layer of the first dielectric material is aligned, in a height dimension relative to the substrate, with a respective second layer of the first dielectric material.

20. The apparatus of claim 18, wherein the second dielectric material is the same as the first dielectric material.

* * * * *